(12) United States Patent
Toda et al.

(10) Patent No.: US 6,295,231 B1
(45) Date of Patent: *Sep. 25, 2001

(54) HIGH-SPEED CYCLE CLOCK-SYNCHRONOUS MEMORY DEVICE

(75) Inventors: Haruki Toda, Yokohama; Kenji Tsuchida; Hitoshi Kuyama, both of Kawasaki, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,102

(22) Filed: Jul. 15, 1999

(30) Foreign Application Priority Data

Jul. 17, 1998 (JP) .................................................. 10-203454

(51) Int. Cl.⁷ ...................................................... G11C 7/00
(52) U.S. Cl. ............................... 365/189.01; 365/230.03; 365/230.08
(58) Field of Search ......................... 365/189.01, 230.01, 365/230.03, 230.08

(56) References Cited

U.S. PATENT DOCUMENTS

| | | |
|---|---|---|
| 4,924,375 | 5/1990 | Fung et al. . |
| 5,126,973 | * 6/1992 | Gallia ............................. 365/230.03 |
| 5,323,358 | 6/1994 | Toda et al. ...................... 365/230.09 |
| 5,537,354 | 7/1996 | Mochizuki et al. . |
| 5,594,704 | 1/1997 | Konishi et al. . |
| 5,596,541 | 1/1997 | Toda ............................... 365/230.03 |
| 5,956,285 | 9/1999 | Watanabe et al. . |

FOREIGN PATENT DOCUMENTS

| | | |
|---|---|---|
| 0 339 224 | 11/1989 | (EP) . |
| 0 771 007 | 10/1996 | (EP) . |
| 0 955 639 | 11/1999 | (EP) . |

OTHER PUBLICATIONS

European Patent Office Search Report dated Apr. 5, 2000.

Yasuharu Sato, et al., Symposium on VLSI Circuits Digest of Technical Papers, "Fast Cycle RAM(FCRAM); a 20–ns Random Row Access, Pipe–Lined Operating DRAM", Jun., 1998, 0–7803–4766–8, 1998 IEEE.

* cited by examiner

Primary Examiner—Terrell W. Fears
(74) Attorney, Agent, or Firm—Banner & Witcoff, Ltd.

(57) ABSTRACT

A high-speed clock-synchronous memory device is provided with a sense amplifier S/A shared by and between cell arrays, and a cell array controller unit CNTRLi, wherein input and output of data/command synchronous with the clock, access command supplies all address data bits (row and column) simultaneously. By acknowledging a change in bits observed between two successive commands, regarding some of address bits configuring access address, the device judges whether the current access is made within the same cell array as the preceding access, between the neighboring cell arrays, or between remote cell arrays. According to the judgement, suitable command cycle is applied. At this time, the command cycle satisfies relationship: $S \geq N \geq F$.

32 Claims, 14 Drawing Sheets

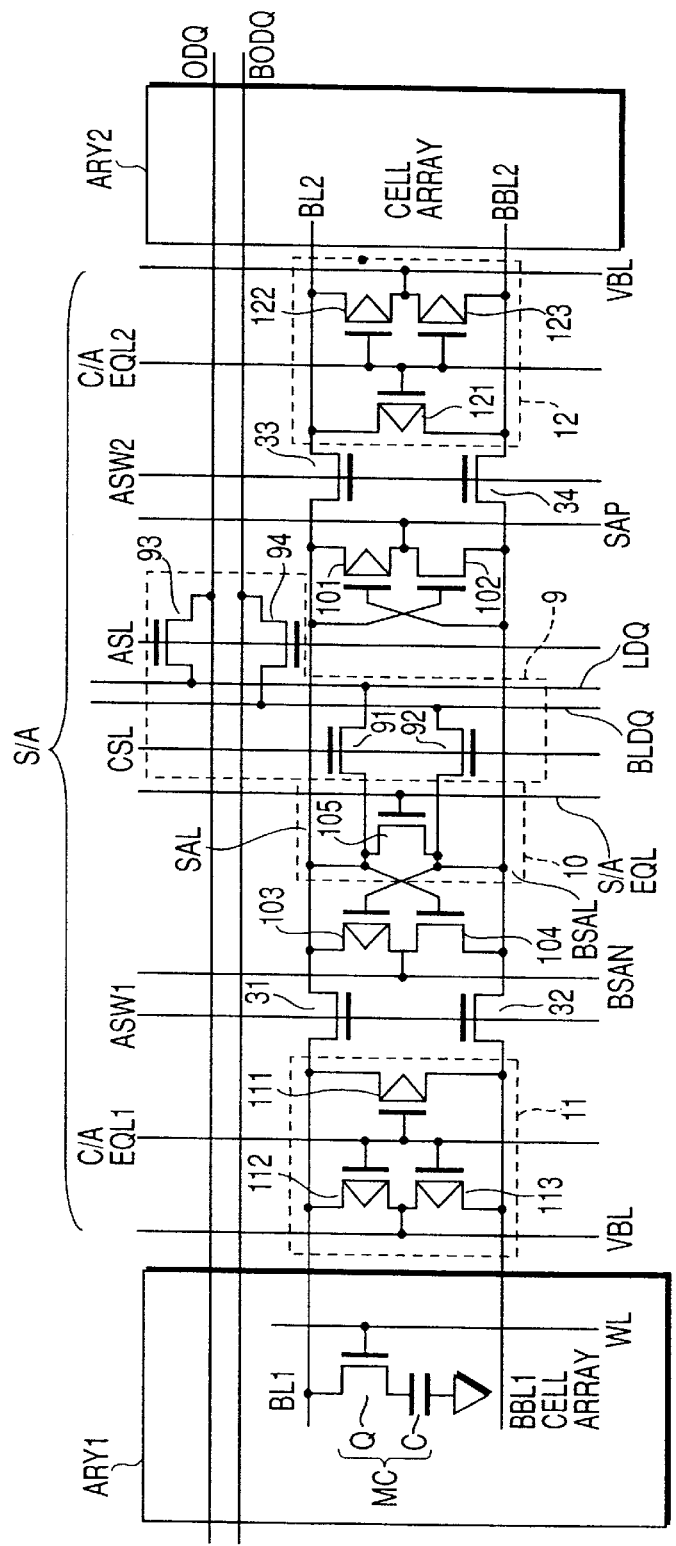

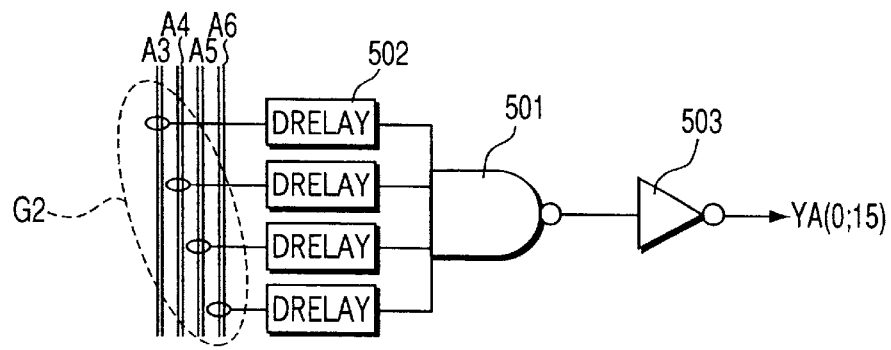
F I G. 7A
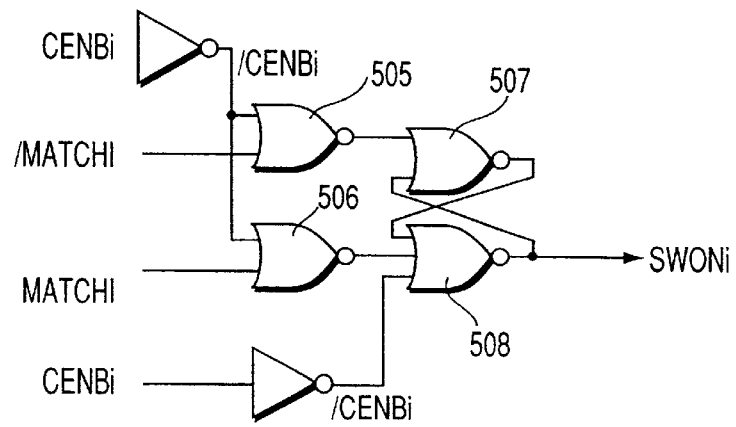
F I G. 7B
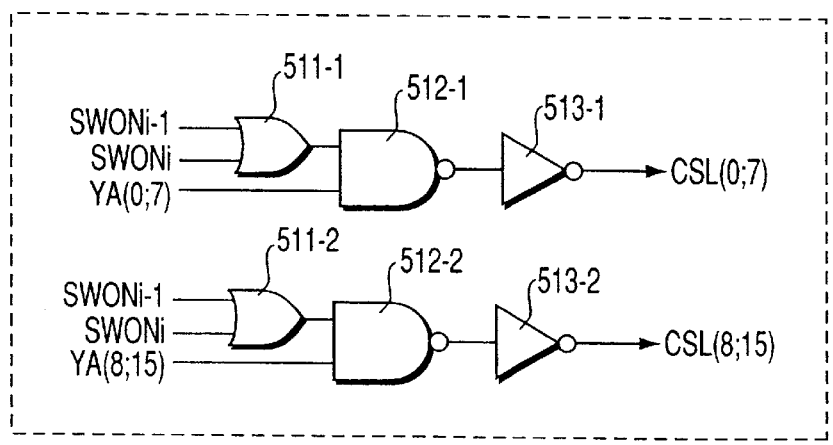
F I G. 7C

F I G. 12A 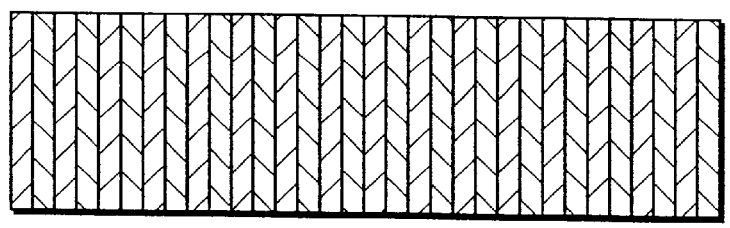
F I G. 12B 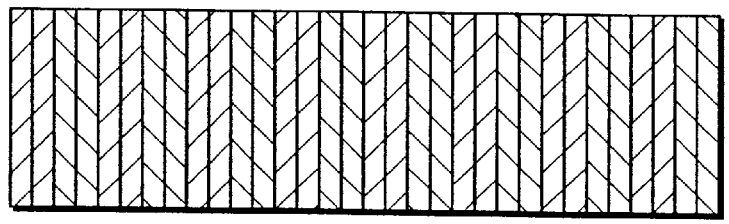
F I G. 12C 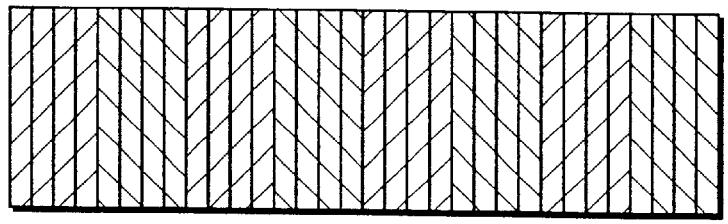
F I G. 12D 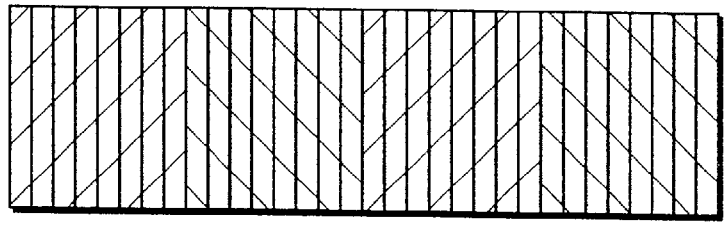
F I G. 12E 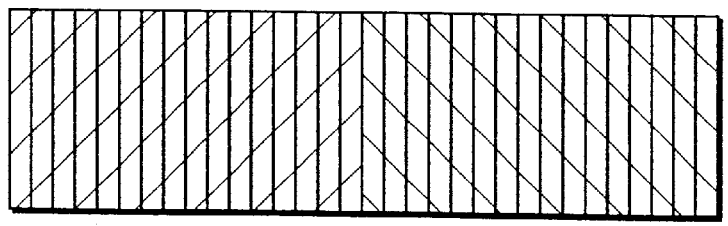
F I G. 12F 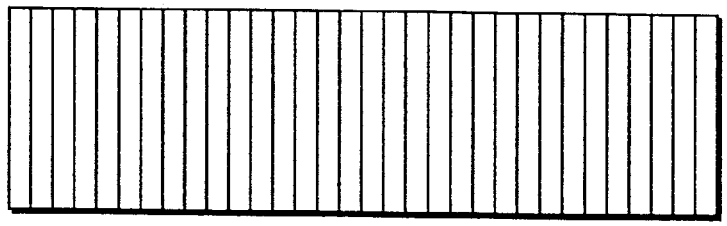

| A24 | |
|---|---|
| A23 | BLOCK |
| A22 | ADDRESS |
| A21 | (FAR ARRAY) |
| A20 | |
| A19 | FAR ARRAY |
| A18 | |
| A17 | N-sup. |
| A16 | NEIGHBOR ARRAY |
| A15 | |
| A14 | |
| A13 | |
| A12 | SAME ARRAY |
| A11 | WL ADDRESS |
| A10 | |
| A9 | |
| A8 | |
| A7 | |

FIG. 13A

| A24 | |
|---|---|
| A23 | BLOCK |
| A22 | ADDRESS |
| A21 | (FAR ARRAY) |
| A20 | FAR ARRAY |
| A19 | |
| A18 | N-sup. |
| A17 | NEIGHBOR ARRAY |
| A16 | |
| A15 | |
| A14 | |
| A13 | |
| A12 | SAME ARRAY |
| A11 | WL ADDRESS |
| A10 | |
| A9 | |
| A8 | |
| A7 | |

FIG. 13B

| A24 | |
|---|---|
| A23 | BLOCK |
| A22 | ADDRESS |
| A21 | (FAR ARRAY) |
| A20 | FAR ARRAY |
| A19 | N-sup. |
| A18 | NEIGHBOR ARRAY |
| A17 | |
| A16 | |
| A15 | |
| A14 | |
| A13 | |
| A12 | SAME ARRAY |
| A11 | WL ADDRESS |
| A10 | |
| A9 | |
| A8 | |
| A7 | |

FIG. 13C

| A24 | |
|---|---|
| A23 | BLOCK |
| A22 | ADDRESS |
| A21 | (FAR ARRAY) |
| A20 | N-sup. |
| A19 | NEIGHBOR ARRAY |
| A18 | |
| A17 | |
| A16 | |
| A15 | |
| A14 | |
| A13 | |
| A12 | SAME ARRAY |
| A11 | WL ADDRESS |
| A10 | |
| A9 | |
| A8 | |
| A7 | |

FIG. 13D

| A24 | |
|---|---|
| A23 | BLOCK |
| A22 | ADDRESS |
| A21 | (FAR ARRAY) |
| A20 | NEIGHBOR ARRAY |
| A19 | |
| A18 | |
| A17 | |
| A16 | |
| A15 | |
| A14 | |
| A13 | |
| A12 | SAME ARRAY |
| A11 | WL ADDRESS |
| A10 | |
| A9 | |
| A8 | |
| A7 | |

FIG. 13E

| A24 | |
|---|---|
| A23 | BLOCK |
| A22 | ADDRESS |
| A21 | (FAR ARRAY) |
| A20 | |
| A19 | |
| A18 | |
| A17 | |
| A16 | |
| A15 | |
| A14 | |
| A13 | |
| A12 | SAME ARRAY |
| A11 | WL ADDRESS |
| A10 | |
| A9 | |
| A8 | |
| A7 | |

FIG. 13F

HIGH-SPEED CYCLE CLOCK-SYNCHRONOUS MEMORY DEVICE

BACKGROUND OF THE INVENTION

This application is based on Japanese Patent Application No. 10-124367, filed May 7, 1998, Japanese Patent Application No. 10-203454, filed Jul. 17, 1998, and U.S. Pat. application Ser. No. 09/305,752, filed May 6, 1999, the contents of which are incorporated herein by reference.

The present invention relates to a semiconductor memory for configuring SDRAM (Synchronous DRAM) which needs to operate at a high-speed, and more particularly high-speed cycle clock-synchronous memory and memory system using the same.

SDRAM has banks comprising, for example, a plurality of memory cell arrays (referred to as "cell array" below). A sense amplifier zone in each back is shared by cell arrays adjacent thereto. Configuration of such a sense amplifier area is allowed to reduce an area occupied by the same. Also, an input/output data line may be shared by each cell array. Data is transferred to a buffer for output data burst via such shared data lines.

When data in an arbitrary cell array is accessed, all of cell arrays in the bank including the accessed cell array are controlled all at once. That is, a word line (WL) in an arbitrary cell array to be accessed is activated to be an active level, and data of each memory cell belonging to this WL is temporally stored by each sense amplifier.

Thereafter, an arbitrary data is read out via an input/output data line. Data of each memory cell belonging to the above-mentioned word line WL is restored. After the WL is set at an inactive level, a bit line and the sense amplifier are equalized. Then, an arbitrary cell array in the bank can be subjected to the next activation.

FIG. 14 is a timing chart showing an example of data access design, according to the prior art described above. /RAS (Row Address Strobe) signal (the leading "P, is capped with a horizontal bar in drawings) makes a word line of a selected cell array active level during "L" (low level). As a result, it becomes possible to access data in each memory cell belonging to the selected WL, that is, the page data.

A value of address (Add) at the time when /RAS signal falls to "L1" designates a cell array and a word line (WL) to be selected (as denoted by (R)). Thereafter, each time /CAS (Column Address Strobe) signal (the leading "P, is capped with a horizontal bar in drawings)falls down, page address is determined (as denoted by (C1) to (C4)). Accordingly, data is output from a sense amplifier in a column corresponding to the page address.

For internal operation, during a period in which /RAS is set at "L", data in each memory cell belonging to the word line WL in the activated cell array is kept in the state of sense, amplified (stored condition) and restore state (S&R). EQL is equalizing operation of a bit line and a sense amplifier. EQL functions after /RAS becomes "H" (high level) and the word line WL becomes an inactive level.

Such data access operation enables a high-speed access to data in a memory cell belonging to selected one word line WL. However, such high-speed access as mentioned above cannot be kept when selection of the WL is frequently changed. This is because access to a column cannot be performed until selection of a new word line becomes possible.

Regarding access to data in cell arrays in the same bank, an attention should be paid to a time from completion of selecting one word line WL1 until it is possible to select another word line WL2.

Selection of the word line WL2 is prohibited until EQL of the internal operation in FIG. 14 is terminated, regardless of the memory cell that the WL2 belongs to. Here, EQL means equalization of the bit line and the sense amplifier concerning to the preceding data access to the word line WL1. Thus, it always takes a fixed and long time to access from a different word line in the same bank.

In general, as well known, DRAM senses data by using a ratio of a cell capacitance and a bit line capacitance to each other. Therefore, it should be considered that a memory is configured to ensure cell capacitor for sensing cell data and to provide a high-speed sense operation. It is preferable to make the number of cells belonging to a bit line connected to one sense amplifier as small as possible. And it is also preferable to reduce the number of cells connected to one word line in order to decrease RC delay time needed as a rise time and a fall time of a word line.

In other words, in view of functional improvement of a memory, a size of a cell array comprising a plurality of memory cells cannot be so large. Therefore, it is preferable to divide a memory into a number of cell arrays.

In a design of a memory, sense amplifiers are shared by adjacent cell arrays. Thus, the area occupied by the sense amplifier becomes half of that in case of not being shared. Such a shared sense amplifier, however, enables only one of the adjacent cell arrays to use the same at a single access.

In recent years, there has been employed a UMA (Unified memory Architecture) in which a single memory is data-accessed by many equipment. By employing a UMA, access to word lines has been changed frequently. As a result, according to the prior art, an unnecessary waiting time during data transfer often occurs. Therefore, such a conventional system needs an improvement for more efficient use of memory data.

BRIEF SUMMARY OF THE INVENTION

In view of considerations described as above, the present invention has been achieved. It is therefore an object of the invention to provide a high-speed cycle clock-synchronous memory and a memory system allowing effective data transfer, which realizes a word line access cycle faster than that in a conventional technique.

A first aspect of the present invention is a high speed cycle clock-synchronous memory device comprising:

a plurality of cell arrays each consisting of a plurality of memory cells;

a sense amplifier circuit part shared by the cell arrays;

a cell array control circuit to which row and column addresses are simultaneously inputted to designate an arbitrary memory cell in the memory cells and which independently controls an access operation every the plurality of cell arrays; and an address structure of the plurality of cell arrays, on the basis of a change in specific bits between a first address and a second address when the first address obtained according to a first command is compared with the second address obtained according to a second command sent subsequent to the first command, by which the accesses according to the first and second commands can be judged to be accesses to the same cell array, accesses to neighboring cell arrays, or accesses to cell arrays which are far from each other can be determined.

A second aspect of the present invention is a high-speed cycle clock-synchronous memory device comprising:
  a plurality of cell arrays each consisting of a plurality of memory cells;
  a sense amplifier shared by the cell arrays; and
  a cell array control circuit to which row and column addresses are simultaneously inputted to designate an arbitrary memory cell in the memory cells and which independently controls an access operation every the plurality of cell arrays,
  wherein the device has a burst access operating mode in which a signal for designating a cycle in which a command is obtained synchronously with a clock and instructing a timing at which a command which continuously maintains a predetermined level at least in a period before the half of the cycle of the clock is used, and
  when an address of the head memory address is supplied, the subsequent addresses can be accessed.

A third aspect of the present invention is a high-speed cycle clock-synchronous memory system comprising:
  a memory part having a plurality of cell arrays each consisting of a plurality of memory cells and to which row and column addresses are simultaneously inputted to designate an arbitrary memory cell among the memory cells, wherein an access operation is independently controlled every the plurality of cell arrays; and
  a memory controller portion for simultaneously supplying an address signal for selecting an arbitrary memory cell in the memory part and a command signal for controlling the memory part to the memory part synchronously with a clock signal,
  wherein the memory controller portion changes the number of clock cycles between the first and second commands on the basis of a change in a specific bit between an address signal obtained according to a first command to the memory part and the address signal obtained according to a second command subsequent to the first command.

A fourth aspect of the present invention is a high-speed cycle clock synchronous memory device comprising:
  a plurality of cell arrays each consisting of a plurality of memory cells, the plurality of cell arrays being positioned according to an address format made up of a plurality of bits;
  sense amplifier circuit parts shared by neighboring cell arrays; and
  a cell array control circuit which receives an address information signal for designating a desired one of the memory cells, which is constructed according to the address format and controls the sense amplifier circuits in accordance with the address information signal,
  wherein when a first command and a second command subsequent to the first command are supplied to the memoryl
  predetermined bits in the address format provide information to identify whether a first cell array corresponding to a first address information signal and a second cell array corresponding to a second address information signal are the same cell array, neighboring cell arrays having a common sense amplifier part, or cell arrays which are far from each other having no common sense amplifier part by comparing the first address information signal provided according to the first command with the second address information signal provided according to the second command.

A fifth aspect of the present invention is a high-speed cycle clock-synchronous memory system comprising:
  at least one high-speed cycle clock-synchronous memory device according to claim 21; and
  a memory control unit for controlling the at least one high-speed cycle clock-synchronous memory device,
  wherein the memory control unit determines the number of command cycles between the first command and the second command on the basis of information provided by predetermined bits in the address format.

Without such a conventional concept of the same bank in which an access between a plurality of cell arrays having a common data transmission system is always controlled at fixed long time intervals, the present invention provides a cell array control circuit so as to control a plurality of cell arrays independently and individually. With this arrangement, it is possible to optimize an access time between different word lines into an essentially minimized time. More particularly, a mutual positional relationship between cell arrays which are accessed successively is judged so that the number of cycles between commands can be minimized.

The memory according to the present invention has another feature in that it provides an address configuration which enables to judge a mutual positional relationship between successively accessed cell arrays by a change of addresses thereof. The memory having the address configuration is suitable for a memory system which first judges a mutual positional relationship between cell arrays which are accessed successively by a change of addresses thereof, and with this judgement, optimizes the number of cycles between commands which decides an access time between different word lines.

A memory cell array where the positional relationship is judged may be a logical cell array comprising a plurality of physical cell arrays where a defective word line can freely replaced with a spare word line among the physical cell arrays. When the present invention is applied to a memory having such logical cell arrays, it will be possible to optimize an access time between different word lines in each memory device into an essentially minimized time while securing a proper quality necessary for a good memory device product by increasing or decreasing the number of logical cell arrays according to the number of occurrences of defective word lines.

For judging a change of addresses, a memory controller portion connected to the memory is used. Responsive to the change of addresses, the memory controller portion controls a signal indicating a timing for taking a command.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a conceptual diagram of the memory system according to the present invention;

FIG. 1C is a circuit diagram corresponding to the area represented by broken line box 123 in FIG. 1B;

FIGS. 7A, 7B and 7C are circuit diagrams each showing a circuit structure of an example of a column switch selecting controller shown in FIG. 5;

FIGS. 12A to 12F are conceptual diagrams each showing logical cell arrays set according to defective state of the memory cell in term of address configuration;

FIGS. 13A to 13F are conceptual diagrams showing allocation of row addresses corresponding to FIGS. 12A to 12F, respectively.

DETAILED DESCRIPTION OF THE INVENTION

Figure 1B:
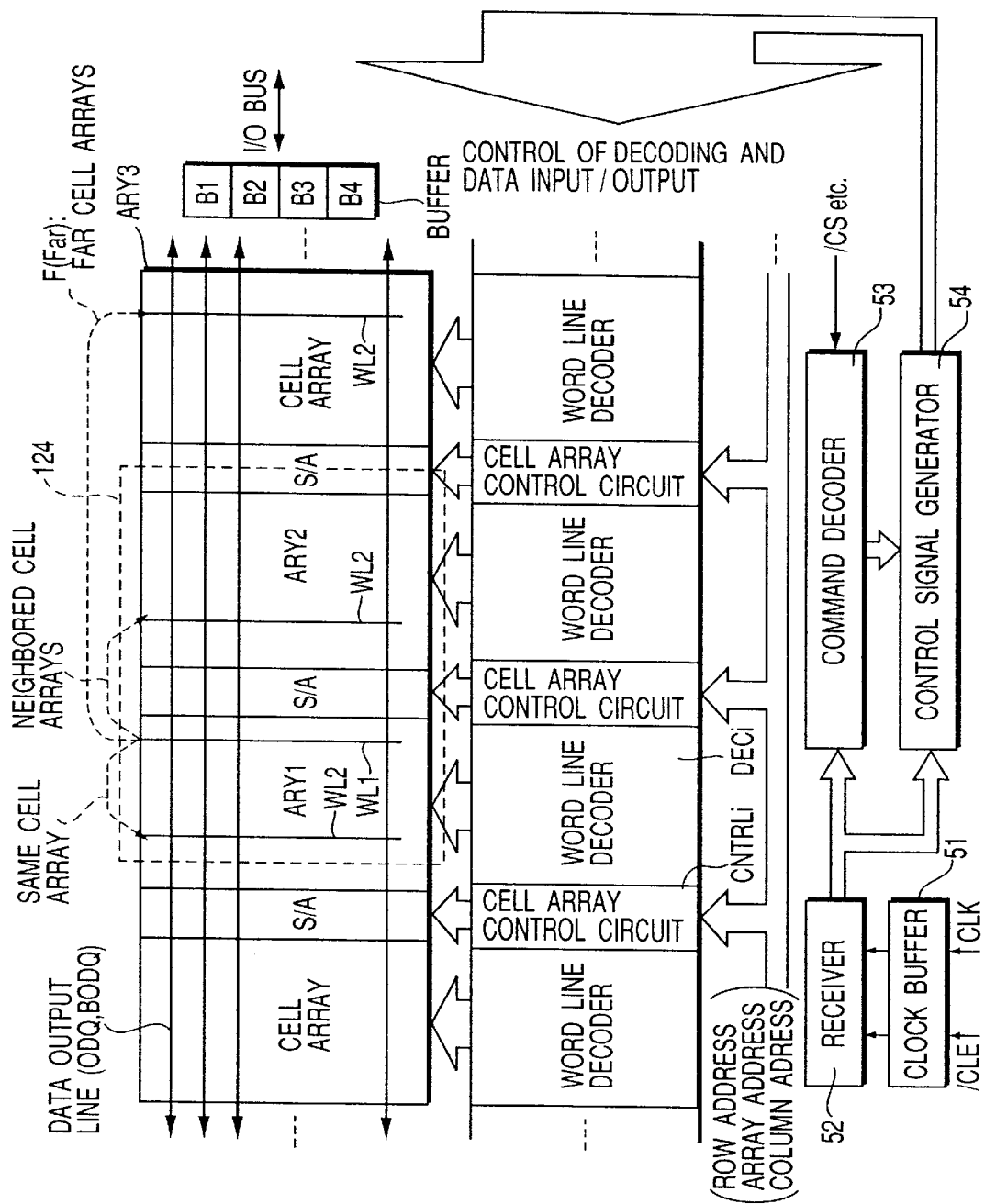
FIG. 1B is a circuit block diagram showing a main part of SDRAM according to the invention.

FIG. 1A is a conceptual diagram of a memory system according to the present invention, FIG. 1B is a circuit block diagram showing a main part of SDRAM according to the invention, and FIG. 1C is a circuit diagram corresponding to the area defined by broken line box 124 in FIG. 1B, where there are two cell arrays and a sense amplifier shared by those two cell arrays.

In FIG. 1A, the operation of the memory portion to store predetermined data and the like is controlled by predetermined signals issued from a memory controller portion (for example CPU). The predetermined signals include a clock signal (CLK) for controlling an operation of each internal circuit in a memory portion, a clock latch enable (/CLE), i.e. a control signal to determine whether or not to take a command into the memory portion at a rise-up time of the clock CLK, an address signal (for example, a row address, a column address, and an array address) for selecting an arbitrary memory cell in the memory portion, and a signal (represented as command related signal) required for a command (e.g. Read command or write command) or the like for specifying operation of the memory portion.

In the above described memory system, signals such as the clock signal, the address signal and the command system signal are transmitted from the memory controller portion to the memory portion. In case of successive write operations, for example, a predetermined memory cell is selected in the memory portion according to row system addresses and column system addresses, then data is written in the selected memory cell. Thereafter, the bit line is precharged and equalized (as described in,detail below). Thereafter, in a case that rewrite operation (restore) is performed, the memory controller portion transmits signals such as address signal and command signal to the memory portion synchronously with a clock signal after an predetermined interval of time, and in the memory portion a write operation is performed in a similar manner to the previous operation described above.

The interval between commands mentioned above (referred to as command interval) conventionally relates to command intervals between a plurality of cell arrays having the common data transmission system, namely, successive access operations (e.g. successive write operations) in the same bank, and has always a constant and long period time, and has been fixed. This time period has been determined in accordance with a time interval with which data is written successively in memory cells in the same cell array. This is the same as successive data read operations.

The memory system according to the present invention, however, can change a command interval according to the kinds of successive accesses (i.e. a case of selecting a memory cell in the same cell array in succession to the previous access, a case of selecting a memory cell in an adjacent cell array in succession to the previous access, or a case of selecting a memory cell in a remote cell array in succession to the previous access).

More particularly, the memory controller portion according to the invention judges the types of successive accesses by a change of address signal inputted successively into the memory portion. Thereby, the memory controller portion can change the command interval, which has been conventionally fixed, and thus controlling the memory portion more efficiently.

To achieve such a high-speed access cycle of a memory, it is important for each cell array to control the cell array for access. This requires an improvement in a sense amplifier and a special design for access. These points are described below.

FIGS. 1B and 1C are circuit block diagrams showing a main part of SDRAM according to the invention. A circuit in FIG. 1C illustrates a sense system for a pair of bit lines (BL, BBL) and a configuration of data transfer from cell arrays. Also, FIG. 1B illustrates a block of a cell array control circuit (CNTRLi), and also illustrates a block of a word line decoder (DECi) which is controlled in association with the cell array control circuit CNTRLi.

A synchronous clock signal CLK and a timing signal /CLE for taking in a command are inputted into a receiver 52 of the clock via a clock buffer 51. The receiver 52 issues a synchronous control signal to perform a synchronous control of inputting address (i.e. a row signal, an array signal or a column signal), and an operational control of a command decoder 53 and a control signal generator circuit 54. The command decoder 53 is also inputted with a control signal such as /CS (chip selecting signal). The control signal generator circuit 54 controls the memory operation in synchronism with the clock signal CLK by a signal from the command decoder 53.

There are disposed a plurality of memory cell arrays (referred to as cell array below). A sense amplifier circuit portion S/A is shared by adjacent two cell arrays, for example, ARY1 and ARY2.

A memory cell MC in a cell array comprises a transistor Q for transfer and a capacitor C for storing data. For a typical example, one memory cell MC connected to a bit line BL1 in the cell array ARY1 is shown. The memory cell MC, for example, corresponds to an arbitrary address connected to a column (e.g. a bit line), belonging to a word line WL, which is an arbitrary row (line) in the cell array ARY1.

It is determined which pair of bit lines on two adjacent cell arrays ARY1 and ARY2 is to be connected to the sense amplifier circuit S/A, by controlling array switch signals ASW1, ASW2.

N channel MOSFETs 31, 32 have respective gates controlled commonly by a array switch signal ASW1. The MOSFET 31 has a conductive path connected to a bit line BL1 at one end and to a sense line BSAL at the other end.

N channel MOSFETs 33, 34 have respective gates controlled commonly by an array switch signal ASW2. The, MOSFET 33 has a conductive path or channel connected to a bit line BBL2 at one end and to a sense line BSAL at the other end.

The sense amplifier circuit portion S/A includes P channel MOSFETs 101, 102 whose sources is supplied with control signals SAP. MOSFETs 101, 102 have respective drains which are connected to the sense lines SAL, BSAL, respectively. MOSFET 102 has a gate connected to the sense line SAL, and MOSFET 101 has a gate connected to the sense line BSAL.

Further, the sense amplifier circuit portion S/A includes N channel MOSFETs 103, 104 whose sources are supplied with control signals BSAP. MOSFETs 103, 104 have respective drains which are connected to the sense lines SAL, BSAL, respectively. MOSFET 104 has a gate connected to the sense line SAL, and MOSFET 103 has a gate connected to the sense line BSAL.

In an enable state, the control signal SAP is set at a high potential source of the sense amplifier circuit portion while the control signal BSAN is set at a low potential source (earth potential) of the sense amplifier circuit portion. Also in a disable state, the control signals SAP, BSAN are set at an intermediate potential not higher than respective threshold voltage levels of MOSFETs 101 to 104.

A DQ gate circuit portion 9 configuring an input/ output line includes a local DQ line and an overlaid DQ line extending in parallel with the bit line. The local DQ line comprises a LDQ and a complementary line BLDQ, and the overlaid DQ line comprises a ODQ and a complementary line BODQ.

The local DQ line LDQ is electrically connected to the sense line SAL via the conductive path of N channel MOSFET 91. The local DQ line BLDQ is electrically connected to the sense line BSAL via the conductive path of N channel MOSFET 92. MOSFETs 91, 92 have respective gates to which connected is the column selecting line CSL.

The overlaid DQ line ODQ is electrically connected to the local DQ line LDQ via the conductive path of N channel MOSFET 93. The overlaid DQ line BODQ is electrically connected to the local DQ line BLDQ via the conductive path of N channel MOSFET 94. MOSFET 93, 94 have respective gates to which connected is the array selecting line ASL.

An equalizer circuit, which equalizes an electric potential between a pair of bit lines, is divided into an equalizer circuit 10 of the sense amplifier circuit portion S/A, an equalizer circuit 11 of the cell array ARY1 and an equalizer circuit 12 of the cell array ARY2.

The equalizer circuit 10 includes a N channel MOSFET 105 which is gate-controlled by an S/AEQL signal. The MOSFET 105 has,a structure in which a source and a drain are connected between the sense lines SAL and BSAL in the sense amplifier circuit portion S/A.

The equalizer circuit 11 includes P channel MOSFETs 111 to 113 which are gate-controlled by a C/AEQL1 signal. MOSFET 111 has a conductive path which is connected between the sense lines SAL and BSAL. MOSFET 112 supplies a bit line precharge potential VBL to the sense line SAL via its conductive path. MOSFET 113 supplies a bit line precharge potential VBL to the sense line BSAL via its conductive path.

The equalizer circuit 12 includes P channel MOSFETs 121 to 123 which are gate-controlled by C/AEQL2 signal. MOSFET 121 has a conductive path which is connected between the sense lines SAL and BSAL. MOSFET 122 supplies a bit line precharge potential VBL to the sense line SAL via its conductive path. MOSFET 123 supplies a bit line precharge potential VBL to the sense line BSAL via its conductive path.

Equalization of the bit line and the sense line before the sense operation can be performed individually and independently by controlling array switch signals ASW1, ASW2 and equalizer signals C/AEQL1, C/AEQL2 and S/AEQL.

The sense lines SAL, BSAL complete equalization more quickly than the bit lines BL, BBL because the former have a capacitance smaller than the latter. After sense and restore operation of the cell array ARY1, for example, the sense lines can be equalized earlier than the bit lines, which can be used for the sense and restore operation of the succeeding cell array ARY2.

There are provided cell array control circuits CNTRLi which enable the sense control for each cell array independently. The cell array control circuit CNTRLi inputs array control signals including an row address, an array address, a column address, and an activation signal (ACT) indicating a command input, and performs a control of activation of the word line and of the sense amplifier (BSAN, SAP), a control of equalization of various parts (typically of EQL), and column related controls (CSL, ASL, ASW).

Such arrangement in that the sense control is performed independently for each cell array, provides a configuration in which each cell array is controlled as one bank. This enables to improve a design of the word line access into those of a more high-speed access cycle.

According to the invention, when the access to a memory cell belonging to a word line WL1 is switched to the access to another memory cell belonging to other word line WL2, it is important to judge a positional relationship between the word lines WL1 and W2. Such judgement enables to minimize the access cycle of the word line.

When the access to the word line WL1 in a cell array is switched to the access to another word line WL2, the positional relationship between WL1 and WL2 will be indicated by one of the following positions:

(1) WL2 is in the same cell array as WL1 (Same: S);
(2) WL2 is in a cell array adjacent to the cell array including WL1 and sharing the sense amplifier (Neighbor: N); and
(3) WL2 is in a cell array far away from the cell array including WL1 and not sharing the sense amplifier (Far: F).

The sense controls are performed independently for each cell array. Therefore, the word line access can be performed at any one of the three positions above even when all the cell arrays sharing the data line are not yet equalized. However, there will be required a certain rule to determine a time interval (interval Wac) between access commands of a word line WL1 and a word line WL2.

In case of Same (1) above, namely, when the word line in the same cell array is selected, for example, the bit line in the cell array ARY1, is sensed and the data restore is performed. Thereafter, controls of signals such as a drive signal of sense amplifier SAP, BSAN, precharge and equalization of sense line SAL, BSAL (S/AEQL signal control), and precharge and equalization of bit line BL1, BBL1 (VBL, C/AEQL1 signal control) are completed, then enabling to select the word line for the succeeding sense operation.

In this case, an interval Wac, representing a time interval between access commands of a word line WL1 and a word line WL2, includes a lapse of time from completion of the precharge and equalization of SAP, BSAN, SAL, BSAL, BL1, and BBL1 until selecting the word line. With this interval Wac being 30 ns, it will become equal to three cycles if the clock cycle is 10 ns.

In case of Neighbor (2) above, namely, when the word line in the adjacent cell array is selected, for example, the bit line in the cell array ARY1, is sensed and the data restore is performed. Then, only if controls of signals such as a drive signal of sense amplifier SAP, BSAN, and precharge and equalization of sense line SAL, BSAL (S/AEQL signal control), are completed, then it will become possible to select the word line for the succeeding sense operation in the adjacent cell array ARY2.

In this case, the interval Wac, representing a time interval between access commands of the word line WL1 and the word line WL2, includes a lapse of time from completion of the precharge and equalization of SAP, BSAN, SAL, and BSAL until selecting the word line. with this interval Wac being 20 ns, it will become equal to two cycles if the clock cycle is 10 ns.

In case of Far (3) above, namely when the word line in the remote of far cell array is selected, it is possible to select the word line for the succeeding sense operation in the remote cell array not adjacent to the cell array ARY1 (ARY3 for example) whenever it becomes able to receive any access command (such as read and write commands). with this interval Wac being 10 ns, it will become equal to one cycle if the clock cycle is 10 ns.

For simplicity of description, only as the equalization operation of the bit line, described are precharge operation of sense amplifier drive signals SAP, BSAN for equalization of the sense lines (SAL, BSAL) described above, and the precharge and equalization operations of bit lines (BL, BBL), if not otherwise noted.

If such an interval Wac of word line access is defined in its specification, access can be effected to the internal operation without causing contradiction. In this case, however, address input is made without address multiplex method in which input timing of row address defers from that of column address.

This means that it becomes important to arrange that physical number of address input signals to coincide with that of rows and columns, and that row and column are addressed simultaneously at the same cycle time. This enables to save a time for giving address command.

Therefore, such arrangement makes it unnecessary to wait for address command for column, which is different from the address multiplex method. Immediately after sense data of the sense amplifier are available for operation, data transmission is started for restoring data at cells. When the restoring is completed, the word line is inactivated and operation of precharge and equalization is started.

Figure 2:
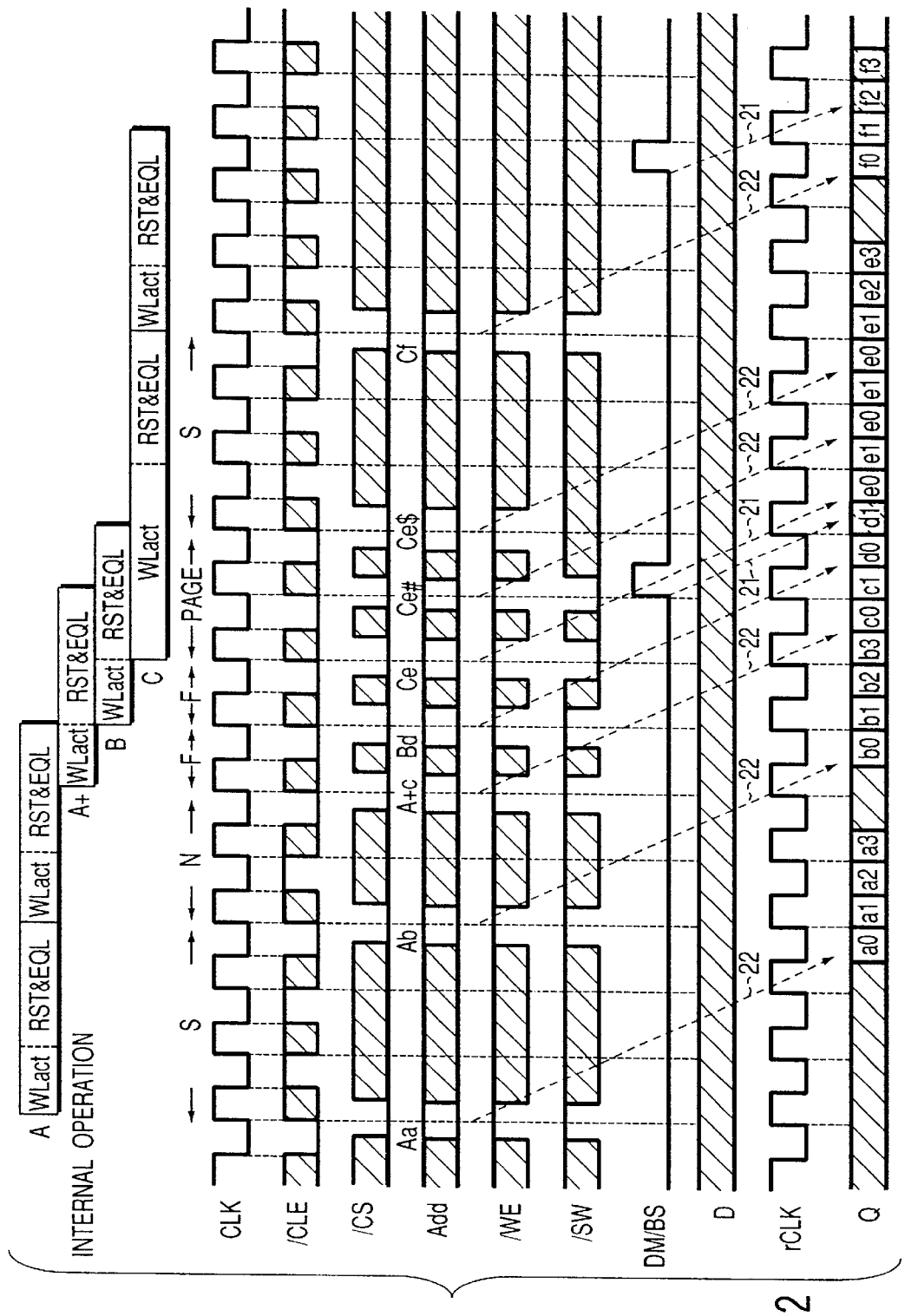
FIG. 2 is a timing chart showing a data read operation of the SDRAM shown in FIGS. 1A and 1B of the invention.

As described above, the first features of the present invention lies in a system row address and column address are supplied simultaneously. The second feature lies in that the access of the word line WL2 succeeding to the word line WL1 in the same bank can be judged by acknowledging where WL2 is positioned; in the same cell array (Same), in an adjacent cell array (Neighbor) or in a remote cell array. Thirdly, in response to this judgement, the number of clock cycles, (namely, the number of clock cycles of an access command input to the next access command input) is defined in such manner that the following relationship is satisfied for lock cycle: "in the same cell array $i_{13}$~ between adjacent cell arrays 2_~!, between remote cell arrays". Cases of the timing setting and internal operation set under this rule are indicated below:

FIG. 2 is a timing chart showing a read operation of SDRAM having a configuration shown in FIGS. 1B and 1C according to the present invention. CLK is a synchronous clock signal, and has a clock cycle of 10 ns in this example. All operations of the memory are synchronous with this clock CLK.

/CLE (clock latch enable) is a timing signal by which command is taken in at a rise-up of CLK if being "L" (low level) ahead of a rise-up of CLK. For the purpose of specifying a cycle time at which a command is taken in synchronously with the clock CLK, it is important to maintain a certain level in a time period before at least a half of the cycle.

/CS (chip select) is a command signal which becomes "L" when a memory chip is selected and a command is valid for the selected chip.

Add is a address command signal which combining low and column addresses designates the leading address of burst data.

Aa indicates that a row a of a cell array A has been designated.

Ab indicates that a row b of cell array A has been designated.

A+c indicates that that a row c of cell array adjacent of cell array A has been designated.

Bd indicates that a row d of cell array B has been designated.

Ce indicates that a row e of cell array C has been designated.

Ce# indicates that a new column # for a row,e of cell array C has been designated.

Ce$ indicates that a new column $ for a row e of cell array C has been designated.

Cf indicates that a row f of cell array C has been designated.

/WE is a command signal indicating whether the given access operation is a read operation or a write operation. As the access operation is the read operation in this figure, all the commands are "H" (high level).

/SW (suspend word line) is a command signal indicating that a word line is not inactivated immediately after the data transmission and is kept active until the next command comes. ISW indicates maintaining an activated state of the word line at the condition of "L".

DM/BS (data mask or burst stop) is a timing signal concerning to data input/output. In a read operation, when "H" is taken in, burst output becomes of high impedance from the data output after one cycle, as indicated with arrow 21.

rCLK is a return clock signal, with which data output from a memory cell is synchronous. rCLK is a delay signal of synchronous clock CLK which in general circulates in the memory system and then is newly inputted from the external (return clock system).

In the return clock system, rCLK phase is delayed relative to CLK, but here it is illustrated in the same phase. Type of data transmission is so called DDR (double data rate) system in which two data are transmitted in one cycle.

In this timing chart, D denotes input data into a memory synchronous with clock CLK, and Q denotes output data from a memory synchronous with clock rCLK. This arrangement, however, is made only here for the simplicity of explanation, and the actual D and Q may be a common data line using the same data bus.

A relationship between command cycle and output of burst data is a 2.5 cycles, as shown by an arrow 22. This means that the number of clock cycles from command input to a data output, i.e. latency, is 2.5.

In the "internal operation" shown in FIG. 2, WLact is a rise-up time period for a word line in the cell array. After an arbitrary word line corresponding to input address is risen, a sense operation is performed immediately, thereby enabling to read data out of a cell array.

When a burst length of data (4 bit in this example) is transferred from the cell array to a buffer, the restoring of cell data and equalization of bit line are simultaneously started. (The word line is descended at the time of equalization.) These operations are shown with RST&EQL.

FIG. 2 is a timing chart showing a sequence of operations; cell array A is first accessed twice consecutively, and then the neighbor array +A, and cell array A and remote cell arrays B, C are accessed, and further page access in the cell arrays and a different word line access in the same cell array C are effected.

Same: In cell array of S (same cell array), sequence of operations of WL and RST&EQL will never be overlapped each other. Interval WAC between commands is 3 cycles as described above.

Neighbor: In cell array of N (neighboring cell arrays), the later half of RST&EQL and WL may be overlapped in operation. Interval WAC between commands is 2 cycles as described above.

Far: In cell array of F (remote cell arrays), even the first half of RST&EQL overlaps WL in operation since WL operation can be started when the access command becomes acceptable. Interval WAC between commands is one cycle as described above.

Figure 3:
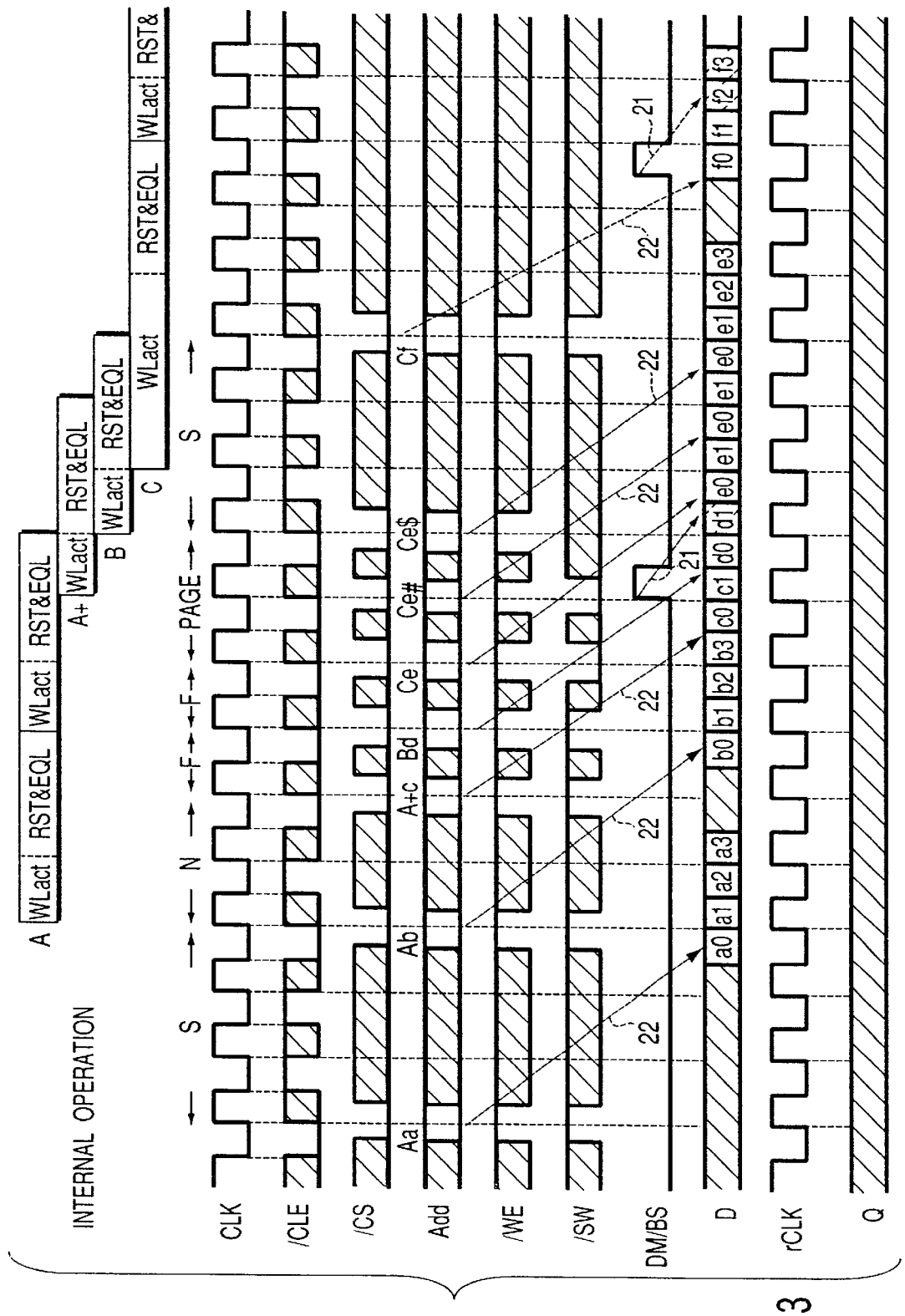
FIG. 3 is a timing chart showing a data write operation of the SDRAM shown in FIGS. 1A and 1B of the invention.

FIG. 3 is a timing chart showing a data write operation of SDRAM having a configuration of FIGS. 1B and 1C according to the invention. In a manner similar to FIG. 2, it shows a sequence of operations; cell array A is first accessed twice consecutively, and then the neighbor array +A, and cell array A and remote cell arrays B, C*are accessed, and further page access in the cell arrays and a different word line access in the same cell array C are effected.

FIG. 3 defers from FIG. 2 only in that a timing of rising up the word line selection is delayed as shown in the internal operation. For its write operation, it becomes possible to transfer data to each sense amplifier and then write the data in each memory cell only after burst data is taken into the buffer.

Latency of write operation is set at 2.5, being the same as read operation. The write operation is started three cycles delayed in comparison with the read operation so that such internal operation starts after two bit amount of burst data are received.

In write operation, when "H" is taken in, DM/BS (data mask or burst stop) signal will mask burst data one cycle later and thus prohibiting the data from being written in the corresponding address as indicated with an arrow 21.

As FIG. 3 shows the write operation, /WE signal is reversed from that in FIG. 2. Data is transmitted to the data bus synchronously with clock CLK as indicted with D.

An example in which a memory having the above design is controlled will be explained below.

Figure 4A:
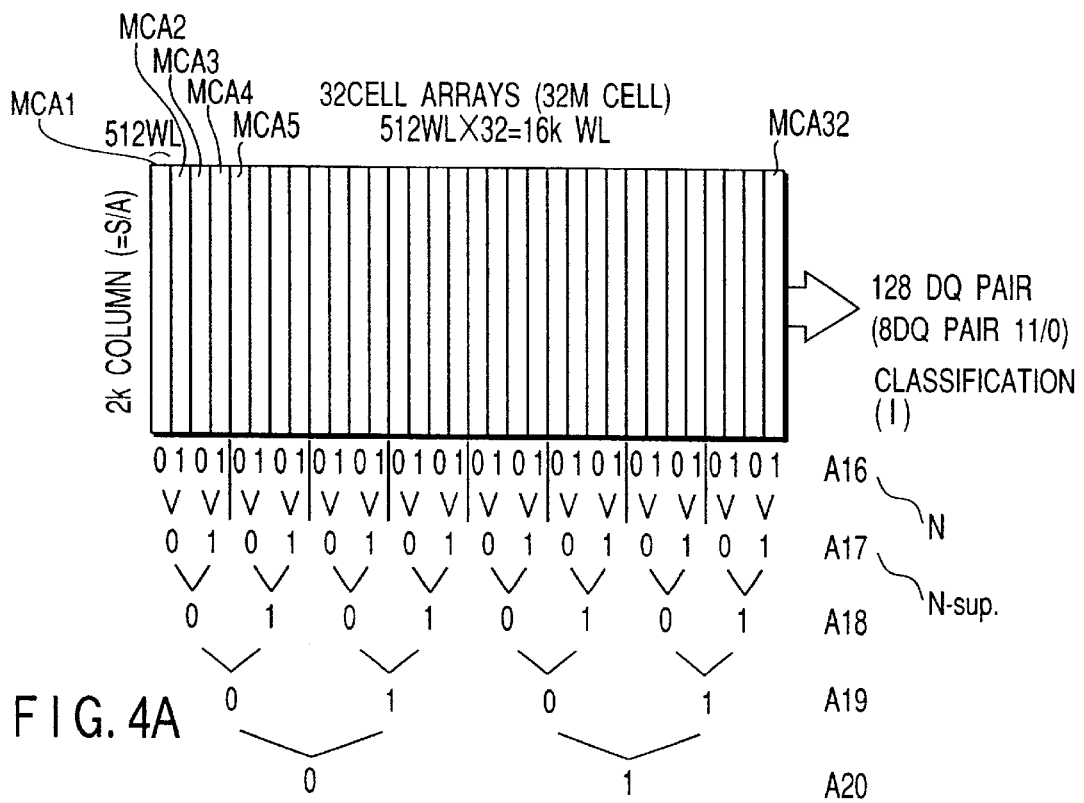
FIGS. 4A and 4B are diagrams illustrating address configurations of cell arrays contained in a 32M bit cell block, which is basic element of memory structure of the invention.
Figure 4B:
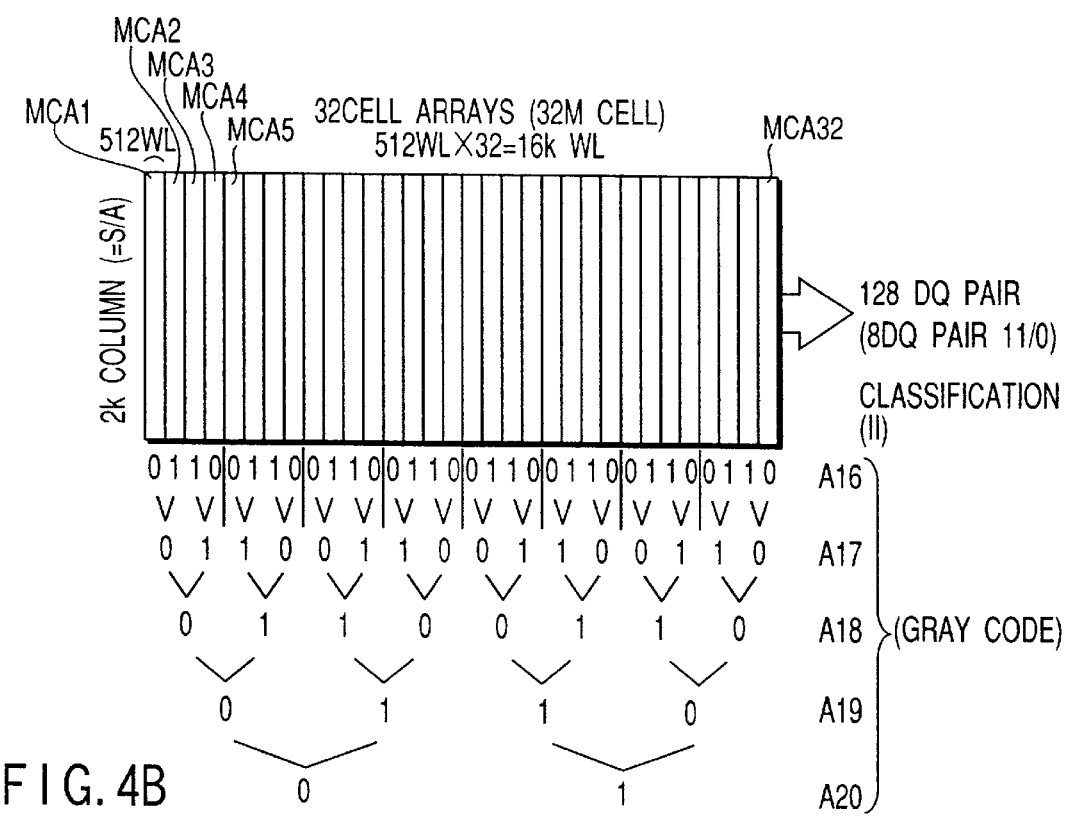

FIGS. 4A and 4B are diagrams illustrating a configuration of cell arrays contained in a 32M bit cell block, which is a basic element of memory structure of the invention. This cell array block comprises 32 units of 1M bit cell array (MAC1 to 32). 1M bit cell array includes 521 word lines (512WL) and 2k columns (2048 columns).

A pair of DQ lines per 16 columns are led commonly from respective cell arrays. This means totally 128 DQ pairs are provided for data transfer in one cell array block. In case of 16 bit 1/0 configuration, it provides 8 DQ pairs per one 1/0 unit. With this arrangement of DQ line blocks, the data to be transferred become burst data of 8 bit at maximum.

In this structure, referring to FIGS. 1B and 1C, for one overlaid DQ line (ODQ), there are provided with 16 column selecting lines (CSL) in respective cell arrays, serving as data transfer switch for transferring data from each one of 16 sense amplifiers to one local DQ line LDQ. Array selecting line (ASL) becomes a transfer switch for connecting a local DQ line LDQ of the selected cell array to a overlaid DQ line ODQ used commonly for all cell arrays.

In FIGS. 4A and 4B, address to select cell arrays MCA 1 to 32 can be indicated with 5 bit of array addresses A16 to A20. FIG. 4A shows a classification methods (I), and FIG. 4B shows a classification method (II).

Now the classification method (I) will be explained. Lower order bit A16 and A17 are referred to as N, N-sup., respectively below. observing a change of bit in N (A16) and N-sup. (A17) in the succeeding access command, it becomes possible to discriminate Same (same cell array), Neighbor (neighboring cell array), and Far (remote cell array) from one another.

Namely, for Same, even one bit of change is not seen in array addresses (A16, . . . A20).

For Far, with N (A16, here) being unchanged, it may change, even if array addresses other than N is one bit (for example in relation between MCA2 and MCA4). When N changes, but neither N nor N-sup-, i.e. neither A16 nor A17 do not change from 1 to 0 or vice versa, bit order other than N and N-sup. changes (for example in relation between MCA2 and MCA 5).

For Neighbor, there may be seen any address changes other than those described above. Namely, only N (A16 here) changes (for example in relation between MCA1 and MCA2). Alternatively, only N and N-sup., i.e. A16 and A17 change simultaneously (for example in relation between MCA2 and MCA3). Otherwise both N and N-sup. change from I to 0 or vice versa (for example in relation between (MCA4 and MCA5).

Now the classification method (II) will be explained. This classification method uses so called gray code, a binary code in which sequential numbers are represented by binary expressions, each of which differs from the preceding expression in one place only. If only one bit among A16 to A20 changes, it can be judged as Neighbor, because of the above nature of the gray code that there is only one place (or one bit) differing between neighboring two expressions. more than two bits change and no bit change are judged as Far, Same, respectively.

Main parts of cell array control circuit CNTRLi and word line decoder DECi in FIG. 1B are described below.

Figure 5:
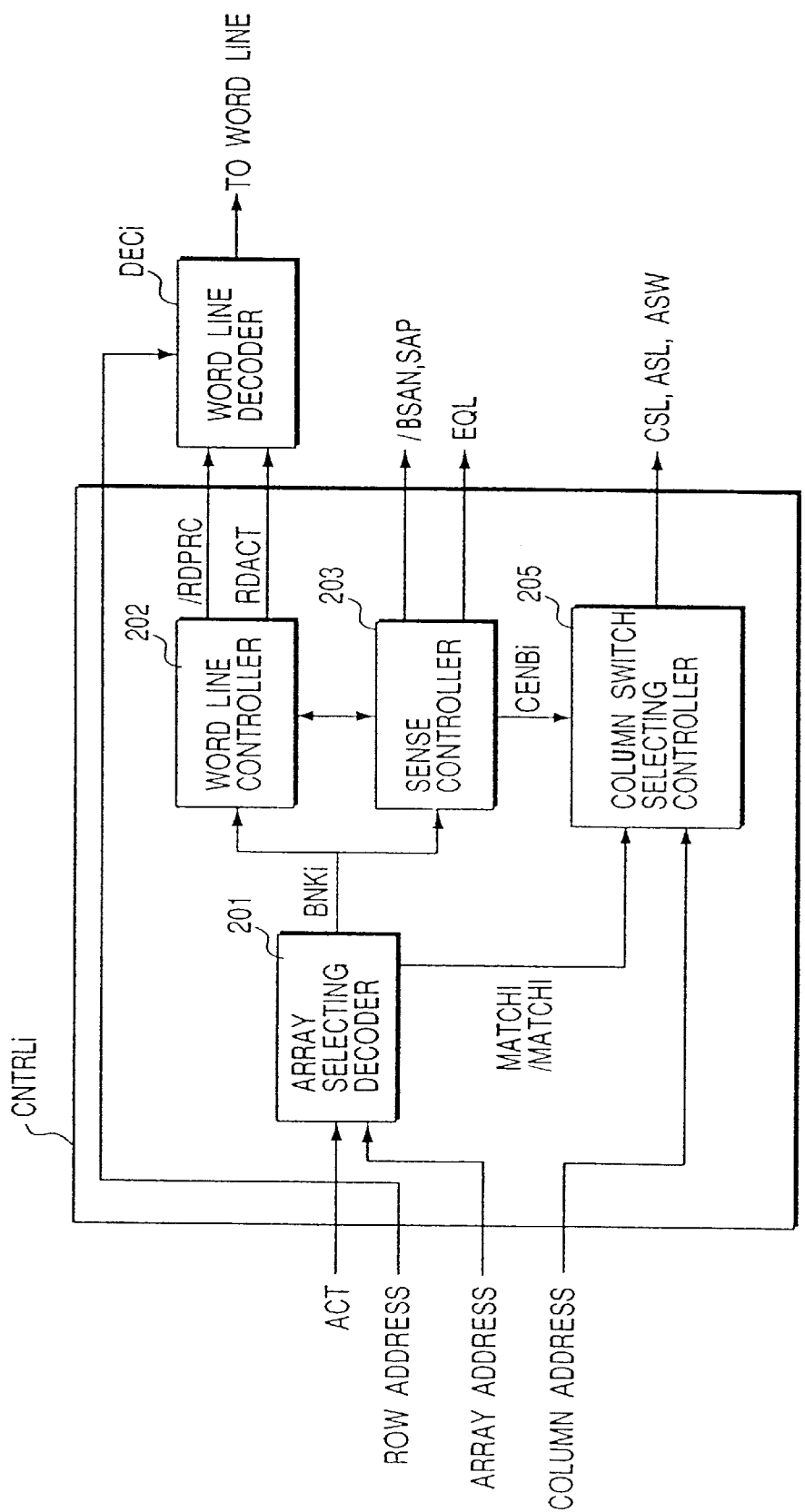
FIG. 5 is a circuit block diagram showing an example of cell array controller circuit and word line decoders shown in FIG. 1A.

FIG. 5 is a circuit diagram showing an example of cell array control circuit CNTRLi and word line decoder DECi in FIG. 1B. In case of cell array of 32M bit cell block structure in FIGS. 4A and 4B, 32 units of this cell array control circuit CNTRLi and word line decoder DECi are provided. (i=1 to 32).

Array selecting decoder 201 inputs activation signal ACT indicating an array address and command input, and outputs complementary signal of MATCHI, /MATCHI and BNKi signal.

A word line controller 202 and a sense controller 203 are controlled by BNKi signal. The word line controller 202 outputs control signal /RDPR, RDACT for the word line decoder DECI. The sense controller 203 outputs control signal CENBi for a column switch selecting controller 205, control signals BSAN, SAP for the sense amplifier circuit S/A, and respective control signals EQL (representing S/AEQL, C/AEQL1, C/AEQL2) for respective equalizer circuits 10, 11, 12.

The column switch selecting controller circuit 205 generates signals CSL, ASL, and ASW by using column address, CENBi and complementary signals of MATCHI, /MATCHI.

The word line decoder DECi controls the selection of word lines by using row address and control signals /RDPRC, RDACT.

Such cell array control circuit CNTRLi and word line decoder DECI are controlled to complete automatically successive operations with a certain delay from a command. The successive operations here include; receiving address, selecting a word line, inactivating the word line, and equalizing column related portions. of course, during a word line selected period, transferring of data amplified by the sense amplifier and restoring of data into cells are effected.

Preferred embodiments of the present invention for major circuit configuration of cell array control circuit CNTRLi and word line decoder DECi disposed in the circuit block are described below.

Figure 6A:
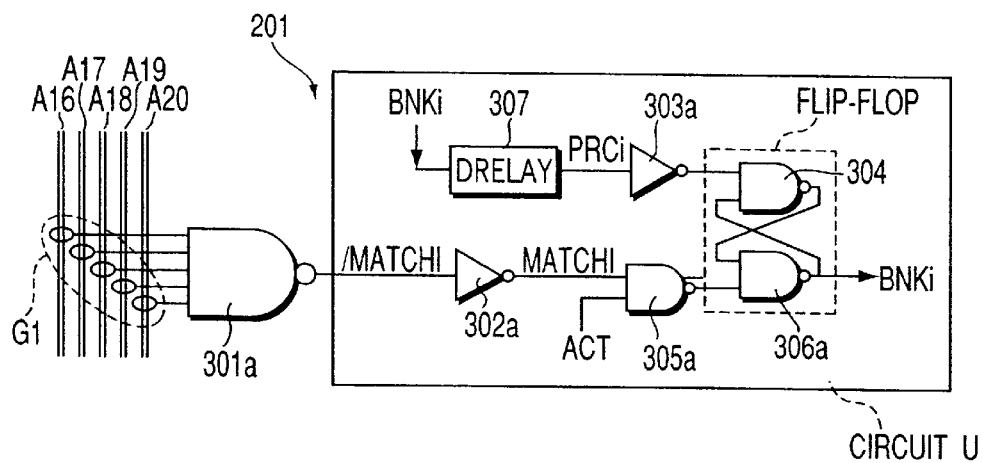
FIGS. 6A and 6B are circuit diagrams each showing an example of an array selecting decoder shown in FIG. 5.
Figure 6B:
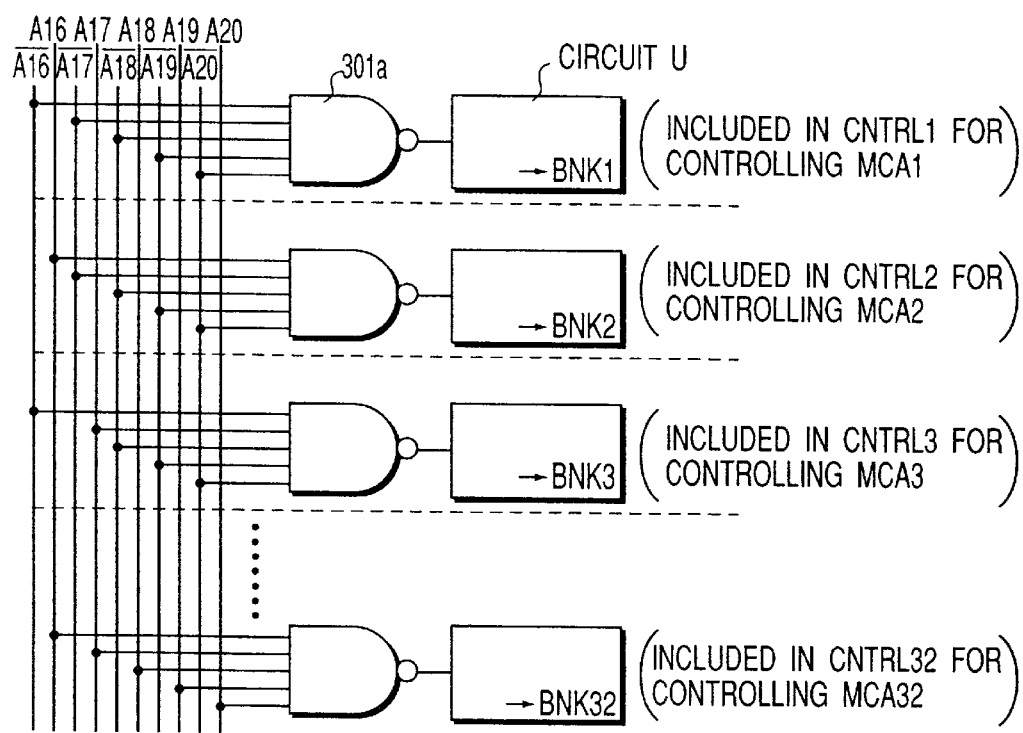

FIG. 6A is a circuit diagram showing an array selecting decoder 201 in the cell array control circuit CNTRLi. NAND gate 301a inputs a signal representing an array address consisting of bits A16 to A20 such as shown in FIGS. 4A and 4B. Connection between the NAND gate 301a and the signal representing address A16 to A20 is denoted with connection G1 for simplicity of explanation. As shown in FIG. 6B, 32 ways of connections are provided at respective complementary lines of address A16 to A20.

Those 32 ways of connections are provided corresponding to respective cell array control circuits CNTRL 1 to 32 disposed in cell arrays NCA1 to MCA32 shown in FIGS. 4A and 4B. (Here is shown connection based on the sorting method (i) of FIG. 4.)

In FIG. 6A, the output of the NAND gate 301a is /MATCHI. The output of the succeeding inverter 302a is MATCHI. MATCHI signal and ACT signal indicating command containing cycle are inputted into a NAND gate 305a. The output of the NAND gate 305a is inputted into a NAND gate 306a, where it is inputted in set of flip-flop.

Output of NAND gate 306a is BNKi.

BNKi signal becomes PRCi signal via delay element 307. PRCi signal is inputted into the NAND gate 304a via the inverter 303a, where it is inputted in reset of flip-flop.

Such array selecting decoder 201, being synchronous with ACT signal (pulse signal), becomes "H" upon a rise-up of BNKi signal corresponding to such cell array having MATCHI signal being "H" (high level), and becomes OIL" (low level) upon a fall of BNKi signal with a certain delay time.

Therefore, from the state that both ACT and MATCHI signals are "H", ACT signal starts to fall to make output of NAND gate 305a "H". Thereafter, the output of flip-flop is kept at "H" until a change of BNKi signal from "L" to OHIO leads to change PRCi signal, such change being delayed by the delay element 307, and eventually changing output of inverter 303a from "H" to OIL". When output of the inverter 303a becomes OIL", both outputs of flip-flop at NAND gate 306a becomes "H", thereby changing BNKi signal from "H" to OIL".

FIGS. 7A to 7C are circuit diagrams each showing a circuit structure included in a column switch selecting controller 205 in the cell array control circuit CNTRLi, in which signal of column selecting line CSL is generated.

In FIGS. 4A and 4B, there are provided with 16 column selecting lines (CSL) serving as a data transfer switch for transferring data from each of 16 sense amplifiers to one local DQ line LDQ. Therefore, this enables to allocate 4 bits address data for each of 16 column addresses. Those address are denoted with A3 to A6 here.

Now the circuit in FIG. 7A will be explained. NAND gate 501 inputs some of column address signals A3 to A6. There are provided with delayed elements 502 in front of input of NAND gate 501. Output of NAND gate 501a becomes a signal YA (0; 15) via the inverter 503.

(0; 15) means that there are 16 YA signals to be generated. for each unit. More particularly, there are 16 (the number of possible combinations of four bits A3 to A6) units provided for respective memory cell arrays each having the structure as shown in FIG. 7A.

Connection between signals A3 to A6 representing an address and the NAND gate 501 are indicated with connection sign G2 similar with connection signs G1 in FIG. 6A. That means that there are provided sixteen connecting combinations of complementary lines of signals A3 to A6 representing an address, for each of 16 units having the structure in FIG. 7A.

Now the circuit I shown in FIG. 7B will be explained. NOR gate 505 inputs /MATCHI signal and /CENBi signal (reverse signal of CENBi). NOR gate 506 inputs MATCHI signal and /CENBi signal. Output of NOR gate 505 represents one of inputs of NOR gate 507. Output of NOR gate 506 represents one of inputs of NOR gate 508.

Output of NOR gate 508 represents one of inputs of NOR gate 507. Output of NOR gate 507 represents one of inputs of NOR gate 508. In addition, NOR gate 08 inputs /CENBi signal. Output of NOR gate represents SWONi signal.

CENBi signal is a signal from the sense controller 203 disposed in the circuit in FIG. 5. Embodiment of the sense controller 203 is not shown in this description. CENBi signal is column enable signal to be generated upon receiving BNKi signal.

That is, in the circuit of FIG. 7B, SWONi signal is set at "H" when CENBi signal is at "H" (/CENBi is "L"). If CENBi signal is at "L" (/CENBi is H"), SWONi signal conform to MATCHI signal.

Now the circuit shown in FIG. 7C will be explained. OR gate 511-1 inputs signal SWONi and signal SWONi-l. Signal SWONi-l is a signal used for a cell array adjacent to other cell array using signal SWONi. That is, signal SWONi-l is generated within the cell array control circuit CNTRLi-1.

NAND gate 512-1 inputs output of OR gate 511-1 and signal YA (0; 7). Output of NAND gate 512-1 generates signal CSL (0; 7) via an inverter 513-1. (0; 7) means that there are 8 CSL signals to be generated corresponding to 8 YA signals (0; 7). More particularly, there are provided. 8 circuit units each comprising 511-1, 512-1 and 513-1.

OR gate 511-2 inputs signal SWONi and signal SWONi+1. Here signal SWONi+1 means a signal used for a cell array adjacent at the other side to the cell array using signal SWONi. That is, signal SWONi+1 is generated within the cell array control circuit CNTRL+1.

NAND gate 512-2 inputs output of OR gate 511-2 and signal YA (8; 15). Output of NAND.gate 512-2 generates signal CSL (8; 15) via an inverter 513-2.

(8; 15) means that there are 8 CSL signals to be generated corresponding to 8 YA signals (8; 15). more particularly, there are provided 8 circuit units each comprising 511-2, 512-2 and 513-2.

FIGS. 8A to 8D are circuit diagrams showing a word line decoder DECi. As show in FIGS. 4A and 4B, each of cell arrays comprises 512 word lines (512 WL). Therefore, this enables to allocate 9 bits address data for each of word lines in one cell array. Those address are denoted with A7 to A15 here.

Now the circuit shown in FIG. 8A will be explained. Node 40 is precharged at high potential (Vboot) by conduction of P channel MOSFET 401 in advance. while providing earth potential level by conduction of N channel MOSFET 405, the node 40 inputs signals out of some addresses A7 to A9 to resume NAND logic.

These gate control signal /RDPRC, RDACT of MOSFET 401, 405 are supplied form the word line controller 202 shown in FIG. 5. Embodiments of the word line controller 202 is not explained in this description. Signal /RDPRC is a precharge signal synchronous with, for example, BNKi signal. Signal RDACT is a control signal to provide give an earth potential during a period of decoding.

In effect, when N channel MOSFET 402 to 404 in series input address signal A7 to A9 at the respective gates, the potential level of node 40 becomes at earth potential "L" if all are turned on, or it becomes high level "H" of Vboot if there is at least one turned off.

Level of the node 40 is latched in the latch circuit. Latch output becomes signal WLD (0; 7) via two inverters IV1, IV2, and becomes signal /WLDR (0; 7) via the inverter IV1.

(0; 7) means that there exist eight signals consisting of WLD, /WLD, respectively. More particularly, there are 8 units having the structure shown in FIG. 8A, i.e. the number of combinations of bits A7 to A9 representing an address.

Connection between respective gates of MOSFET 402 to 404 and address A7 to A9 are indicated with connection sign G3 which similar with connection signs G1 in FIG. 6A, for the purpose of simplification in explanation. This means that there are provided with 8 connecting combinations of complementary lines of addresses A7 to A9 for each of 8 units.

Figure 8A:
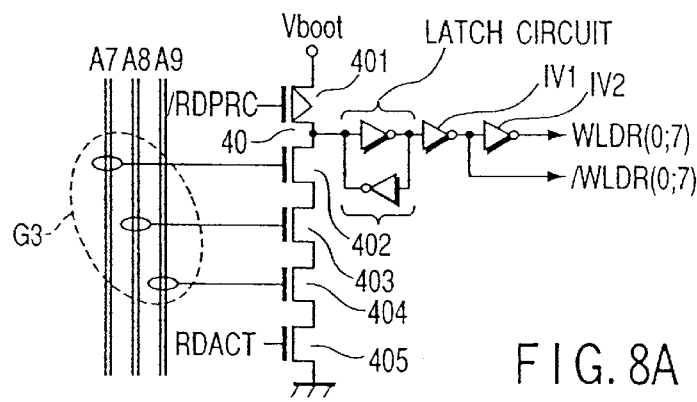
FIGS. 8A to 8D are circuit diagrams showing a circuit structure of a word line decoder shown in FIG. 5.
Figure 8B:
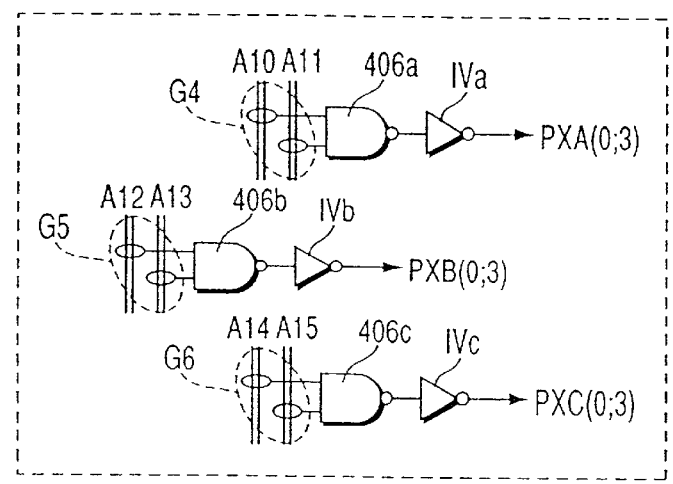

In a circuit of FIG. 8B, the remaining word line address A10 to A15 are used. NAND gate 406a resumes NAND logic in pattern of address A10 and All.' Output of NAND gate 406a becomes PXA (0; 3) via an inverter IVa.

NAND gate 406b resumes NAND logic in pattern of address A12 and A13. Output of NAND gate 406b becomes PXB (0; 3) via an inverter IVb.

NAND gate 406c resumes NAND logic in pattern of address A14 and A15. Output of NAND gate 406a becomes PXC (0; 3) via the inverter IVc.

(0; 3) means that there exist 4 signals for each of PXA, PXB, PXC to be generated. More particularly, there are 4 units each having the structure shown in FIG. 8B, i.e. corresponding to the number of combinations of bits representing the address.

Connection between NAND gate 406a and address A10 to All is indicated with connection sign G4 which is similar to connection sign G1 in FIG. 6A for the purpose of simplification of explanation. This means that there are provided with 4 connecting combinations of complementary lines of address A10, All for respective 4 units each comprising NAND gate 406a and the inverter IVa.

Further, connection signs G5 for NAND gate 406b address A12 to A13, and connection signs G6 for NAND gate 406c and address A14 to A15 are constructed in a similar manner to that of G4.

Figure 8C:
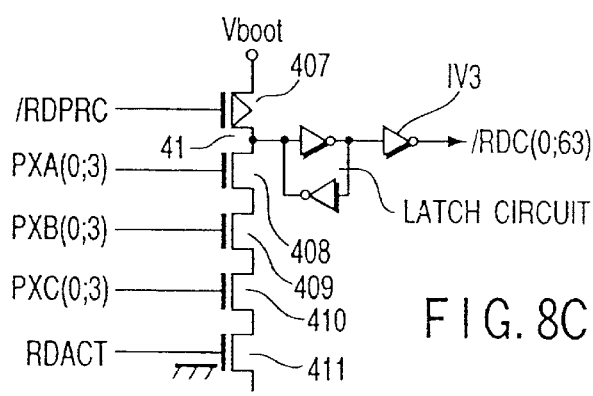

Now the circuit shown in FIG. 8C will be explained. Node 41 is precharged at high potential level (Vboot) by conduction of P channel MOSFET 407 in advance. while providing earth potential level by conduction of N channel MOSFET 411, the node 41 resumed a NAND logic in respective signal patterns of PXA (0; 3), PXB (0; 3), PXC (0; 3).

Gate control signal /RDPRC, RDACT of MOSFET 407, 411 are similar to those explained in FIG. 8A. The signal /RDPRC is a precharge signal synchronous with, for example, BNLi signal. Signal RDACT is a control signal to provide an earth potential during a period of decoding for addresses A7 to A9.

In effect, if N channel MOSFETs 408 to 411 in series are all turned on by gate controls of respective signals PXA (0; 3), PXB (0; 3), PXC (0; 3), the node 41 becomes at earth potential "L1', and if there is at least one turned off, it becomes high level "H" of vboot.

Level of the node 41 is latched in the latch circuit. Latch output becomes signal /DRC (0; 63) via inverter IV3. (0; 63) means that there exit 64 signals of /DRC. More particularly, there are 64 structure units in FIG. 8C, i.e. the number of combinations of signals PXA (0; 3), PXB (0; 3), PXC (0; 3).

Figure 8D:
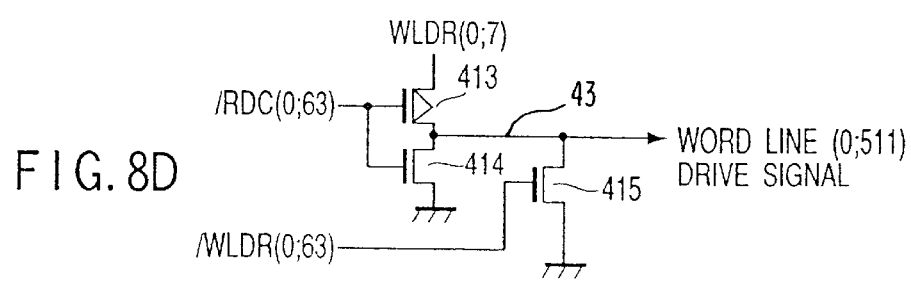

Now the circuit shown in FIG. 8D will be explained. P channel MOSFET 413 is supplied to its source with the level of signal WLDR (0; 7). N channel MOSFET 414 is supplied to its source with the earth potential.

MOSFET 413, 414 are gate-controlled by signal /RDC (0; 63). There is provided a conductive path of N channel MOSFET 415, which is connected between connection node 43 in drains of MOSFET 413 and 414 and an earth potential. The MOSFET 415 has a gate to which the level of signal /WLDR(0; 7) is supplied.

Level of connection node 43 becomes word line drive signal (0; 511). (0; 511) means that there exist 512 word line drive signals corresponding to the number of word lines. More particularly, there are 512 units each having the structure shown in FIG. 8D, i.e. the number of combinations of signals /RDC (0; 63), WLDR (0; 3) (/WLDR (0; 3) is determined unilaterally).

Figure 9:
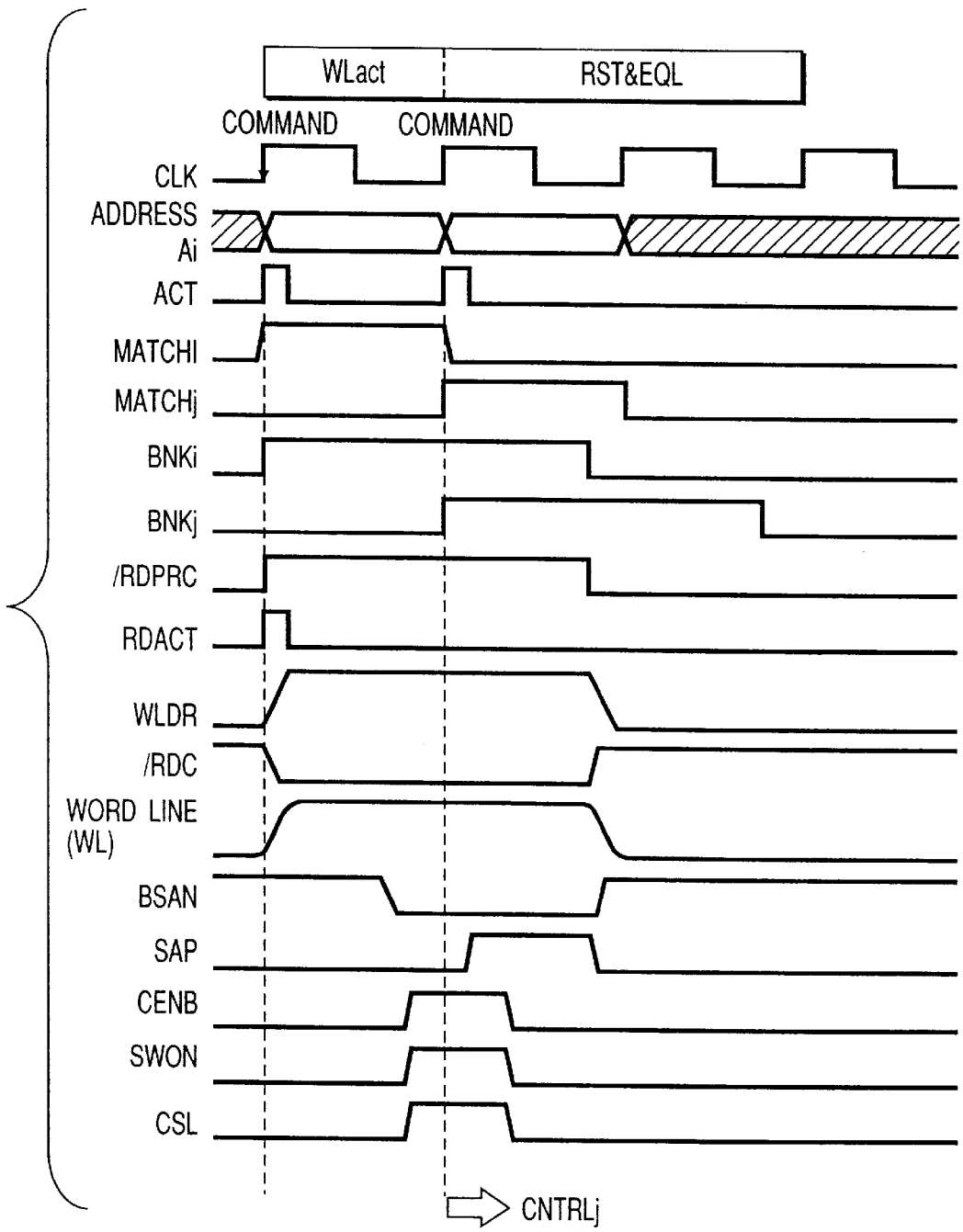
FIG. 9 is waveform diagrams showing a circuit operation of the cell array control circuit and the word line decoder shown in FIG. 5.

FIG. 9 is a waveform diagram showing circuit operations of the cell array control circuit CNTRLi and the word line decoder DECi. Major internal signals shown in circuit structures in FIGS. 6A to 8D are also shown. Command is supplied in synchronism with clock CLK, and ACT signals is issued, and the circuit operates in accordance with address Ai (i.e. row address, array address, column address here).

Though the signals from the sense controller 203 are not described in detail, as noted above, there are shown BSAN, AP which are activation signals for sense amplifier. Though the respective control signals EQL are not shown here, but S/AEQL, C/AEQL1, C/AEQL2, for example, become active at the same timing. At least, active state of S/AEQL will terminate earlier than those of C/AEQL1 and C/AEQL2, and is utilized for the succeeding access before being connected to a predetermined bit line.

In addition, the cell array control circuit CNTRLj is the one which is not adjacent to but far away from the cell array control circuit CNTRLi. CNTRLj operates following a waveform, similar to that of CNTRLi coming later than the second command.

Figure 10:
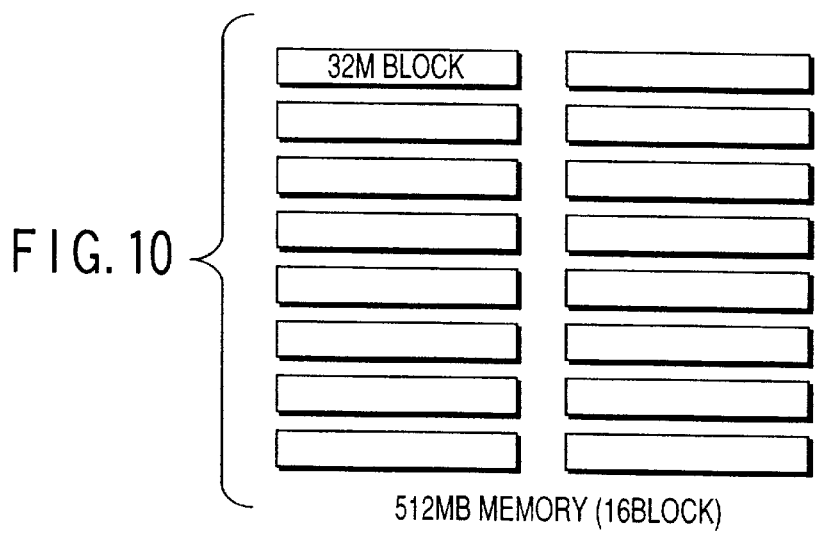
FIG. 10 is a layout block diagram of an cell array constituting 512M bit memory consisting from 32M bit basic blocks according to the invention.

I FIG. 10 is an layout block diagram of cell arrays constituting 512M bit memory, which comprises 32M bit basic blocks as described above. The memory is formed by arranging 16 blocks of cell arrays, as shown in FIG. 10, each block consisting of a 32M-bit cell array shown in FIGS. 4A and 4B. 4-bit address is necessary to designate one of the blocks.

Figure 11:
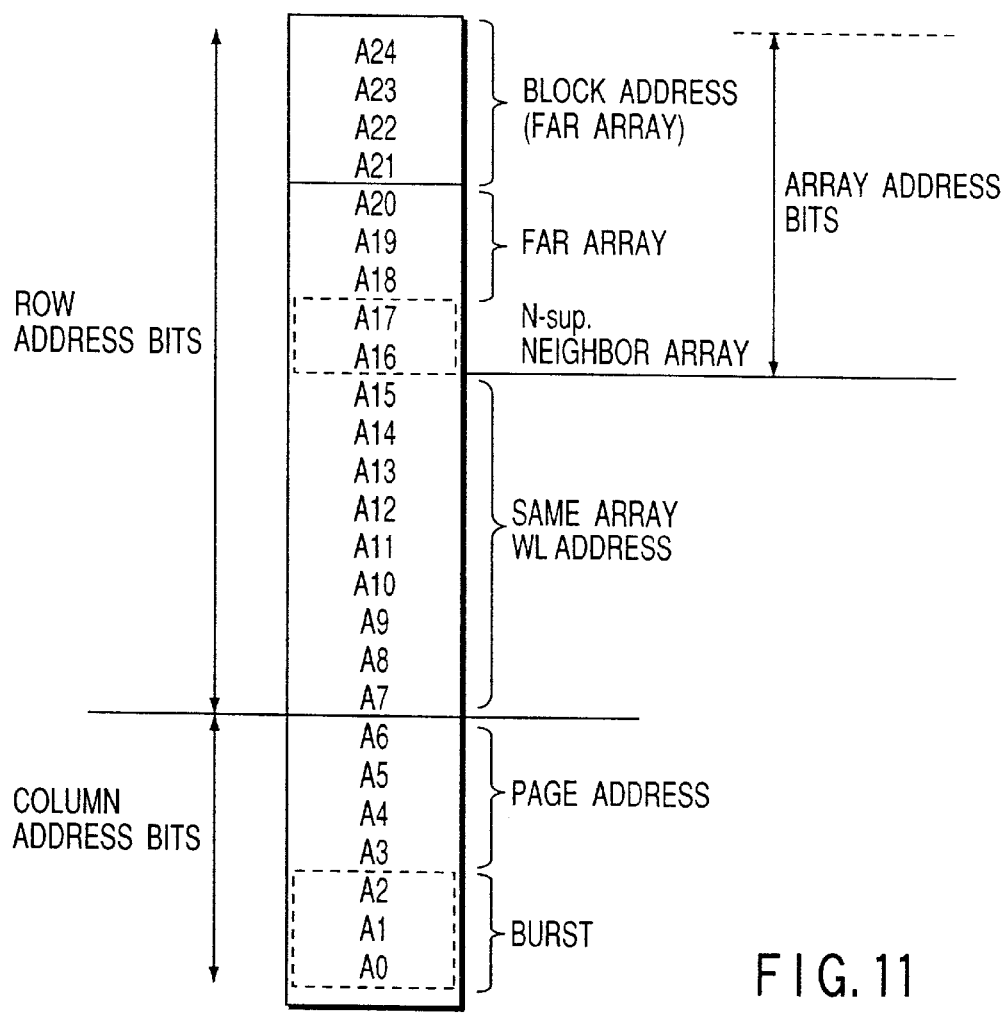
FIG. 11 is a conceptual diagram showing a role of 25 bits for identifying an address in 512M bit memory.
Figure 14:
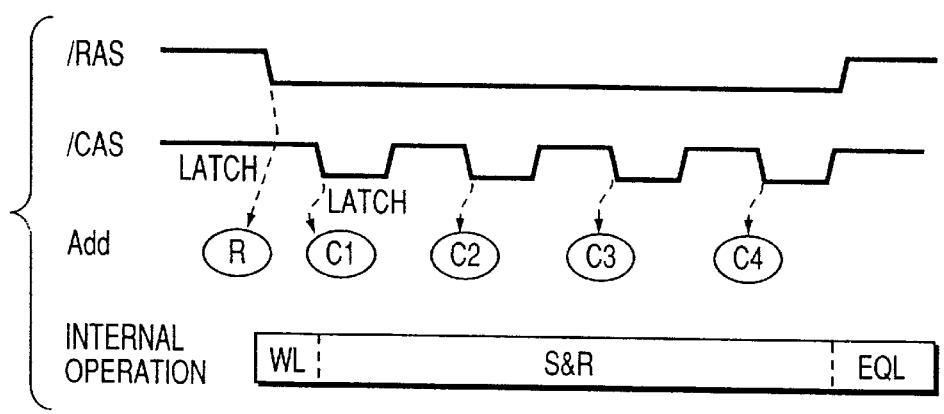
FIG. 14 is a timing chart showing an example of data access design according to a conventional technique.

FIG. 11 shows a role of 25 bits constituting an address of 512M bit. As explained in FIGS. 4A and 4B, each word line is connected to 2k (2048) columns via respective memory cells. These columns constitute a page equivalent of 16 bit 1/O. That is, every 8DQ pairs of 128DQ pairs (pairs of local DQ lines) form one 1/O. A column address is composed of A0 to A6, i.e. total 7 bits. Among the 7 bits, 3 bits A0 to A2 represent a burst address. Since 8DQ pairs form one 1/O, 8 bit burst is obtained at maximum. The remaining bits A3 to A6 constitute a page address.

Now row address will be explained. As the cell arrays are composed of 512 word lines in this embodiment of the invention, A7 to A15, total 9 bits, are allocated to address word lines in the same cell arrays Same.

Array address will be explained now. Total 5 bits, A16 to A20, are allocated to discriminate cell arrays in the 32M bit cell array block. Among them, A16 and A17 are important bits to discriminate Same (same cell arrays), Neighbor (adjacent cell arrays), and Far (remote cell arrays). Address relationship is already explained referring to FIGS. 4A and 4B.

The remaining bits A18 to A20 are those related to Far. Also total 4 bits, A21 to A24, are a block address to direct one of the 32M bit blocks of the blocks constituting 512M bit memory.

By employing a gray code for A16 to A20, whether or not a change in one of the bits other than block address bits among the row address bits occurs is used to judge the Neighbor.

So far all the considerations have be developed on assumption that an address should be set based on physical minimum unit of a cell array constituting 32M bit cell array block (FIGS. 4A and 4B), that is, a physical cell array of 1M bit. However, one logical cell array in a 32M cell array block may become larger in size than the physical cell array depending on how word line address block are set., That will improve freedom of memory.

A case in which redundancy is provided in cell array will be explained with reference to cell arrays in FIG. 4A, 4B or 10. In addition to 512 word lines, each of cell arrays is provided with more than one spare word line for replacement of a defective word line regarded as defective (referred to as defective word line hereinafter).

Given that such defective word line is replaced with a spare word line. if use of such spare lines is limited to those included in the physically same cell array to which the defective word line belongs, the replaceable area range of word lines is consistent with the physical structure in that one 32M bit block has 32 units of cell arrays as described above.

In this case, however, replacement of defective word line is limited to a small physical cell array. As a result, a spare replacement cannot be effected, if a number of defections take place intensively in one cell array, thus making redundancy less efficient.

On the other hand, if free replacement of defective word line with a spare word line can be made mutually between neighboring cell arrays, freedom in replacing defective word line increase as twice as the preceding case, thus making redundancy more efficient.

If a defective word line included in any one of cell arrays in one 32M bit block is replaceable with one of spare word lines in any one of cell arrays, maximum efficiency of redundancy can be obtained. According to this system, a memory system can be realized by selectively determining a cell array range where spare word line can be replaced dependent on conditions of occurrence of defective word line.

It is therefore possible to provide a memory device which optimizes an access time between different word lines with high utilization rate of redundancy by applying the present invention with a memory system concept that the cell array range (referred to as "logical cell array" hereinafter) where spare word lines can be replaced can be varied in size by address setting depending on utilization rate of redundancy.

With this arrangement, the number of logical cell arrays included in one block becomes the maximum (which equals to the number of physical cell arrays in the block) if there found no defective word lines. If there found any defective word lines, the number of logical cell arrays included in one block will be reduced depending on the number of defective word lines. This enables to maintain the suitable quality of the memory device.

FIGS. 12A to 12F are diagrams each showing logical cell arrays formed depending on the defection of memory cells.

FIG. 12A shows a case in which replacement of defective word lines takes place within one physical cell array in which the defective word lines are included. one logical cell array is composed of one physical cell array. This arrangement is the same as that of FIG. 11.

FIG. 12B shows a case in which replacement of defective word lines takes place freely between two neighboring physical cell arrays, that is, in which one logical cell array is formed of two neighboring physical cell arrays. If it is presumed that word line address is set based on the physical cell array as shown in FIG. 12A, it is impossible to determine which cell array the replaced spare word line belongs to, by referring to the address. In this context, it is therefore necessary to make a mapping of logical address so that each of adjacent pairs of physical cell arrays, discriminated graphically with diagonal lines in the drawings, corresponds to one logical cell arrays.

FIG. 12C shows a case in which replacement of defective word lines arrays takes place freely between four neighboring physical cell arrays, that is, in which one logical cell array is formed of four neighboring physical cell arrays. If it is presumed that word line address is set based on the physical cell array as shown in FIG. 12A, it is impossible to determine to which one of the four cell arrays, combined together, a spare word line should be belonged, by only an address. It is therefore necessary to make a mapping of logical address so that each of four physical cell arrays, discriminated graphically with diagonal lines in the drawings, corresponds to one logical cell arrays.

FIG. 12D shows a case in that replacement of defective word lines takes place freely between eight neighboring physical cell arrays, that is, in which one logical cell array is formed of eight neighboring physical cell arrays. If it is presumed that word line address is set based on the physical cell array as shown in FIG. 12A, it is impossible to determine to which one of the eight cell arrays, combined together, a spare word line should be belonged, by only an address. It is therefore necessary to make a mapping of logical address so that each of eight physical cell arrays, discriminated graphically with diagonal lines in the drawings, corresponds to one logical cell arrays.

FIG. 12E shows a case in which replacement of defective word lines arrays takes place freely between sixteen neighboring physical cell arrays, that is, in which one logical cell array is formed of sixteen neighboring physical cell arrays. If it is presumed that word line address is set based on the physical cell array as shown in FIG. 12A, it is impossible to determine to which one of the sixteen cell arrays, combined together, a spare word line should be belonged by only an address. It is therefore necessary to make a mapping of logical address so that each of sixteen physical cell arrays, discriminated graphically with diagonal lines in the drawings, corresponds to one logical cell arrays.

FIG. 12F shows a case in which replacement of defective word lines takes place freely among all physical cell arrays of a whole 32M bit block. If it is presumed that word line address is set based on the physical cell array as shown in FIG. 12A, it is impossible to determine to which cell arrays, a spare word line should be belonged, by only address. It is therefore necessary to make a mapping of logical address so that the physical cell arrays of the whole block corresponds to one logical cell array.

FIGS. 13A to 13F are conceptual diagrams showing allocation of row addresses. Configurations in FIGS. 13A to 13F correspond to those in FIGS. 12A to 12F, respectively. For convenience of explanation, column address is omitted here.

Each address is set based on the physical cell array as shown in FIGS. 12A to 12F. To achieve a high-speed cycle, discrimination bit(s) of Same (same cell array), Neighbor (neighboring cell array), and Far (remote cell array) may be also provided accordingly if necessary.

It should be noted that the number of physical cell arrays forming one logical cell array increases in accordance with a transition from FIGS. 12A to 12F. In effect, transitioning from FIGS. 13A to 13F, the number of bits of word line address in Same increases, and thus the bit order of N and N-sup. shifts up. In FIG. 13F, there disappears a concept of neighboring cell arrays.

As noted above, address allocation suggests how the cell array configuration should be conformed to memory operations. Responsive to such address allocation, the memory controller portion, not shown, modifies a bit range of array addresses, which enables to discriminate Same, Neighbor, and Far as for cell arrays to be accessed. In case of utilizing the gray code, Neighbor is found when array address excluding block address is changed at only one bit.

With the arrangement described above, when a word line is defective, the word line to which a cell sensed simultaneously in a cell array belongs is replaces with a spare word line. by serving the cell array including the spare word line as a new cell array, it is possible to discriminate the same cell array, the neighboring cell array, and remote cell array. This means that the memory can be operated based on decision of command cycle according to the present invention, even if the redundancy may be or not be used.

According to the present invention, as described above, it is possible to minimize the number of cycles between arbitrary address access commands. The system enables the memory controller portion (such as CPU) to determine based on a change of a certain address where it should be accessed, i.e. mutual positional relationship of cell arrays (whether it is within the same cell array, to the adjacent cell array, or to the remote cell array), and thus it become possible to determine the timing of inputting access command with the essentially minimum cycle time. As a result, efficiency of data transfer can be largely improved.

According to the present invention, positional relationship of cell arrays to be accessed are judged from a change of address, which optimized the number of cycles between commands to the essential minimum. It is therefore possible to provide a high-speed cycle clock-synchronous memory and a memory system having an substantially improved efficiency of data transfer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-speed cycle clock-synchronous memory device comprising:

a plurality of cell arrays, each comprising a plurality of memory cells;

a sense amplifier circuit section shared by said cell arrays; and a cell array control circuit to which row and column addresses are inputted to designate an arbitrary one of said memory cells and which controls an access to each of said plurality of cell arrays, independently of any other cell array, wherein the cell arrays have such an address configuration that a first address obtained according to a first command is compared with a second address obtained according to a second command received after the first command and whether an access is made to the memory cells of the same cell array, of neighboring cell arrays, or of remote cell arrays in accordance with the first and second commands is determined from a difference between the first and second addresses in terms of specific bits.

2. A memory device according to claim 1, wherein the number of clock cycles between said first and second commands satisfies the following relation:

(Number of clock cycles when the cells of the same array are accessed)

$\geqq$(Number of clock cycles when the cells of neighboring arrays are accessed)

$\geqq$(Number of clock cycles when the cells of remote arrays are accessed).

3. A memory device according to claim 1, wherein a signal for maintaining a predetermined level at least for a period before half a cycle of a clock is used to designate a timing of receiving a third command simultaneously with the clock.

4. A memory device according to claim 1, wherein said cell arrays can be accessed in a burst access operation mode in which memory cells having subsequent addresses can be accessed when an address of a head memory cell is supplied by a third command.

5. A memory device according to claim 1, wherein latency, which is a period from supply of said command until a clock cycle in which data is transmitted or received, is the same at the time of data reading operation as at the time of data writing operation.

6. A memory device according to claim 1, wherein
said address configuration shows a physical position of each of said cell arrays and is encoded in the form of a gray code which changes only one bit between neighboring cell arrays.

7. A memory device according to claim 1, wherein said cell arrays each comprises at least one spare word line, said at least one spare word line replaces a word line when the word line to which cells simultaneously detected by said sense amplifier circuit section are connected is regarded as being defective in said cell array, and the cell array including the spare word line which has replaced the word line regarded as defective is used as a new cell array, whereby it is determined whether an access is made to the memory cells of the same cell array, of neighboring cell arrays, or of remote cell arrays.

8. A high-speed cycle clock-synchrononous memory device comprising:

a plurality of cell arrays, each comprising a plurality of memory cells;

sense amplifiers shared by said cell arrays; and a cell array control circuit to which row and column addresses are inputted to designate an arbitrary one of said memory cells and which controls an access to each of said plurality of cell arrays, independently of any other cell array, wherein a signal for maintaining a predetermined level at least for a period before half of a cycle of a clock is used to designate a timing of receiving a command simultaneously with the clock, and subsequent addresses can be accessed when an address of a head memory cell is supplied, in a burst access operating mode.

9. A memory device according to claim 8, wherein with respect to receipt of the command, it is determined whether an access is made to the memory cells of the same cell array, of neighboring cell arrays, or of remote cell arrays in accordance with first and second commands, from presence or absence of a change in a specific bit between an address obtained according to the first command and an address obtained according to the second command received after the first command, and a number of clock cycles between the first and second commands satisfy the following relation:

(Number of clock cycles when the cells of the same array are accessed)

≧(Number of clock cycles when the cells of neighboring cells are accessed)

≧(Number of clock cycles when the cells of remote arrays are accessed).

10. A memory device according to claim 8, wherein latency, which is a period from supply of an access command until a clock cycle in which data is transmitted or received, is the same at the time of data reading operation as at the time of data writing operation.

11. A memory device according to claim 9, wherein an address indicative of a physical position of said cell array is encoded in the form of a gray code which changes only one bit between neighboring cell arrays.

12. A memory device according to claim 11, wherein each of said cell arrays has at least one spare word line which replaces a word line to which cells simultaneously detected by said sense amplifier circuit section are connected when the word line is regarded as being defective in said cell array, and an address is allocated to each of memory cell arrays so that a cell array in the word line replaced with the spare word line is used as a new cell array, whereby it is determined whether an access is made to the memory cells of the same cell array, of neighboring cell arrays, or of remote cell arrays.

13. A high-speed cycle clock-synchronous memory system comprising:

a memory section having a plurality of cell arrays, each comprising a plurality of memory cells and to which row and column addresses are inputted to designate an arbitrary memory cell among said memory cells, wherein an access to each cell array is controlled independently of any other cell array; and a memory controller section for simultaneously supplying an address signal for selecting an arbitrary one of said memory section and a command signal for controlling said memory section to said memory section synchronously with a clock signal, wherein said memory controller section changes the number of clock cycles between first and second commands on the basis of change in specific bits between an address signal obtained according to the first command supplied to the memory section and an address signal obtained according to the second command received after the first command.

14. A memory system according to claim 13, wherein said memory controller section supplies to said memory section a signal designating a timing of receiving a third command, thereby to designate a cycle in which the command signal is obtained by said memory section.

15. A memory system according to claim 13, wherein said memory controller section determines whether an access is made to the memory cells of the same cell array, of neighboring cell arrays, or of remote cell arrays, and controls a signal designating the timing of receiving a third command so that a number of clock cycles between the first and second commands satisfy the following relation:

(Number of clock cycles when the cells of the same array are accessed)

≧(Number of clock cycles when the cells of neighboring cells are accessed)

≧(Number of clock cycles when the cells of remote ads are accessed).

16. A memory system according to claim 13, wherein said memory controller section can control a burst access operation of accessing subsequent addresses when an address of a head memory cell is supplied to said memory section by a third command.

17. A memory system according to claim 13, wherein latency, which is a period from supply of an access command until a clock cycle in which data is transmitted or received, is controlled in the same way at the time of data reading operation as at the time of data writing operation.

18. A memory system according to claim 13, wherein in said memory section, an address indicative of a physical position of said cell array is encoded in the form of a gray code which changes only one bit between neighboring cell arrays.

19. A memory system according to claim 15, wherein said memory section has at least one spare word line which replaces a word line to which cells simultaneously detected by said sense amplifier circuit section are connected, when the word line is regarded as being defective, and said memory controller section uses, as a new cell array, a cell array in the word line replaced with an arbitrary spare word line in accordance with said address signal, and determines the number of clock cycles between said first command and said second command.

20. A high-speed cycle clock synchronous memory device comprising:

a plurality of cell arrays each comprising a plurality of memory cells, said plurality of cell arrays being positioned according to an address format composed of a plurality of bits;

sense amplifier circuits shared by neighboring cell arrays; and a cell array control circuit for receiving an address information signal formed in said address format and designed to designate a desired one of said memory cells, and for controlling said sense amplifier circuits in accordance with said address information signal, wherein when a first command and a second command subsequent to said first command are supplied to said memory, predetermined bits in said address format provide information showing whether a first cell array and a second cell array corresponding to a first address information signal and a second address information signal, respectively, are identical, neighboring cell arrays having a common sense amplifier section, or remote cell arrays having no common sense amplifier section, by comparing the first address information signal provided according to said first command with the second address information signal provided according to said second command.

21. A memory device according to claim 20, wherein the number of command cycles in a period from inputting of the first command corresponding to said first address information signal to supplying of the second command corresponding to said second address information signal differs in accordance with whether said first and second cell arrays are identical, neighboring cell arrays, or remote cell arrays.

22. A memory device according to claim 21, wherein predetermined bits in said address format comprise:
   at least one bit of a remote cell array identification bit indicating whether cell arrays are remote cell arrays; and
   two bits of neighboring cell array identification bits indicating whether cell arrays are neighboring cell arrays.

23. A memory device according to claim 22, wherein said address format is determined by using a gray code.

24. A memory device according to claim 23, wherein in comparison with said first address information signal and said second address information signal,
   said first cell array and said second cell array are identical when said remote array identification bit and said neighboring cell array identification bit are the same, are neighboring cell arrays when only one bit of either said remote cell array identification bit or said neighboring cell array identification bit has changed, and are remote cell arrays when at least two bits in said remote cell array identification bit and said neighboring cell array identification bit have changed.

25. A memory device according to claim 21, wherein predetermined bits in said address format further comprise at least one word line identification bit for specifying any one of the word lines in the same cell array, wherein
   each of said plurality of memory cell arrays has at least one spare word line,
   a predetermined number of neighboring cell arrays constitute a logical cell array,
   a defective word line in said logical cell array can be replaced by any one of the at least one spare word lines in any of the cell arrays forming said logical cell array, and
   the number of said remote cell array identification bits and the number of said word line identification bits are determined in accordance with the number of cell arrays forming said logical cell array.

26. A memory device according to claim 25, wherein the number of said remote cell array identification bits is $2^{2-M-2-2N}$ and the number of said word line identification bits is $2^{L+N}$, when $M \geq 4$ and $N \geq 1$,
   where 2L is the number of word lines each cell array has, $2^M$ is the total number of said cell arrays, and $2^N$ is the number of cell arrays constructing said single logical cell array.

27. A memory device according to claim 25, wherein said neighboring cell array identification bit is a higher order bit as compared with said word line identification bit, and said remote cell array identification bit is a higher order bit as compared with said neighboring cell array identification bit.

28. A high-speed cycle clock-synchronous memory system comprising:
   at least one high-speed cycle clock-synchronous memory device including
      a plurality of cell arrays each comprising a plurality of memory cells, said plurality of cell arrays being positioned according to an address format composed of a plurality of bits;
      sense amplifier circuits shared by neighboring cell arrays; and
      a cell array control circuit for receiving an address information signal formed in said address format and designed to designate a desired one of said memory cells, and for controlling said sense amplifier circuits in accordance with said address information signal,
      wherein when a first command and a second command subsequent to said first command are supplied to said memory, predetermined bits in said address format provide information showing whether a first cell array and a second cell array corresponding to a first address information signal and a second address information signal, respectively, are identical, neighboring cell arrays having a common sense amplifier section, or remote cell arrays having no common sense amplifier section, by comparing the first address information signal provided according to said first command with the second address information signal provided according to said second command; and
      wherein the number of command cycles in a period from inputting of the first command corresponding to said first address information signal to supplying of the second command corresponding to said second address information signal differs in accordance with whether said fist and second cell arrays are identical, neighboring cell arrays, or remote cell arrays;
   a memory control unit for controlling said at least one high-speed cycle clock-synchronous memory device,
   wherein said memory control unit determines the number of command cycles between said first command and said second command on the basis of information provided by predetermined bits in said address format.

29. A memory system according to claim 28, wherein the number of command cycles between said first and second commands satisfies the following relation:
   (number of command cycles when the memory cells of the same cell array are accessed).
   $\geq$(number of command cycles when the memory cells of the neighboring cell arrays are accessed).
   $\geq$(number of command cycles when the memory cells of the remote cell arrays are accessed).

30. A high-speed cycle clock-synchronous memory device according to claim 1, wherein said row and column addresses are simultaneously inputted.

31. A high-speed cycle clock-synchronous memory device according to claim 8, wherein said row and column addresses are simultaneously inputted.

32. A high-speed cycle clock-synchronous memory system according to claim 13, wherein said row and column addresses are simultaneously inputted.

* * * * *

UNITED STATES PATENT AND TRADEMARK OFFICE
CERTIFICATE OF CORRECTION

PATENT NO. : 6,295,231 B1  
DATED : September 25, 2001  
INVENTOR(S) : Haruki Toda et al.

Page 1 of 1

It is certified that error appears in the above-identified patent and that said Letters Patent is hereby corrected as shown below:

Column 20,  
Line 67, "comprises" has been replaced with -- comprise --.

Column 22,  
Line 33, "ads" has been replaced with -- arrays --.

Column 23,  
Line 62, "$2^{2-M-2-2N}$" has been replaced with -- $2^{M-2-2N}$ --.

Signed and Sealed this

Eighth Day of October, 2002

Attest:

Attesting Officer

JAMES E. ROGAN  
Director of the United States Patent and Trademark Office